(12) United States Patent  
Toor et al.

(10) Patent No.: US 8,815,104 B2  
(45) Date of Patent: *Aug. 26, 2014

(54) COPPER-ASSISTED, ANTI-REFLECTION ETCHING OF SILICON SURFACES

(75) Inventors: Fatima Toor, Sturbridge, MA (US); Howard Branz, Boulder, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 64 days.

This patent is subject to a terminal disclaimer.

(21) Appl. No.: 13/423,745

(22) Filed: Mar. 19, 2012

(65) Prior Publication Data  
US 2012/0178204 A1 Jul. 12, 2012

Related U.S. Application Data

(63) Continuation-in-part of application No. 12/053,445, filed on Mar. 21, 2008, now abandoned.

(51) Int. Cl.  
*H01L 31/18* (2006.01)  
*B44C 1/22* (2006.01)

(52) U.S. Cl.  
USPC ............... 216/24; 216/90; 216/99; 438/71; 257/E31.13

(58) Field of Classification Search  
None  
See application file for complete search history.

(56) References Cited

U.S. PATENT DOCUMENTS

| | | |
|---|---|---|
| 4,111,762 A | 9/1978 | Wade et al. |
| 4,960,177 A | 10/1990 | Holm-Kennedy et al. |
| 5,196,088 A | 3/1993 | Soda |
| 5,250,460 A | 10/1993 | Yamagata et al. |
| 5,264,375 A | 11/1993 | Bang et al. |
| 6,093,941 A | 7/2000 | Russell et al. |
| 6,178,033 B1 | 1/2001 | Ford et al. |
| 6,284,317 B1 | 9/2001 | Laibinis et al. |

(Continued)

FOREIGN PATENT DOCUMENTS

| | | |
|---|---|---|
| CN | 101916787 | 10/2010 |
| JP | 2000261008 | 9/2000 |

(Continued)

OTHER PUBLICATIONS

Branz et al., "Nanostructured Black Silicon and the Optical Reflectance of Graded-Density Surfaces," Applied Physics Letters vol. 94, Issue 23, Jun. 2009, pp. 231121 (1-3).

(Continued)

*Primary Examiner* — Allan Olsen  
(74) *Attorney, Agent, or Firm* — John C. Stolpa

(57) ABSTRACT

A method (300) for etching a silicon surface (116) to reduce reflectivity. The method (300) includes electroless deposition of copper nanoparticles about 20 nanometers in size on the silicon surface (116), with a particle-to-particle spacing of 3 to 8 nanometers. The method (300) includes positioning (310) the substrate (112) with a silicon surface (116) into a vessel (122). The vessel (122) is filled (340) with a volume of an etching solution (124) so as to cover the silicon surface (116). The etching solution (124) includes an oxidant-etchant solution (146), e.g., an aqueous solution of hydrofluoric acid and hydrogen peroxide. The silicon surface (116) is etched (350) by agitating the etching solution (124) with, for example, ultrasonic agitation, and the etching may include heating (360) the etching solution (124) and directing light (365) onto the silicon surface (116). During the etching, copper nanoparticles enhance or drive the etching process.

20 Claims, 11 Drawing Sheets

(56) References Cited

U.S. PATENT DOCUMENTS

| | | | |
|---|---|---|---|
| 6,329,296 B1 * | 12/2001 | Ruby et al. | 438/712 |
| 6,383,936 B1 | 5/2002 | Tsai et al. | |
| 6,538,801 B2 | 3/2003 | Jacobson et al. | |
| 6,721,083 B2 | 4/2004 | Jacobson et al. | |
| 6,759,313 B2 | 7/2004 | Yamazaki et al. | |
| 6,762,134 B2 * | 7/2004 | Bohn et al. | 438/745 |
| 6,790,785 B1 * | 9/2004 | Li et al. | 438/745 |
| 6,899,816 B2 | 5/2005 | Padhi et al. | |
| 6,905,622 B2 | 6/2005 | Padhi et al. | |
| 7,052,587 B2 | 5/2006 | Gibson et al. | |
| 7,090,783 B1 | 8/2006 | Cui et al. | |
| 7,135,414 B2 | 11/2006 | Matsumura et al. | |
| 7,141,490 B2 | 11/2006 | Yamazaki et al. | |
| 7,476,573 B2 * | 1/2009 | Cohen | 438/149 |
| 7,585,786 B2 | 9/2009 | Goo et al. | |
| 7,718,254 B2 * | 5/2010 | Matsumura et al. | 428/317.9 |
| 7,833,391 B2 | 11/2010 | Fan et al. | |
| 8,053,270 B2 * | 11/2011 | Dimitrov et al. | 438/71 |
| 8,053,328 B2 * | 11/2011 | Cohen | 438/424 |
| 8,075,792 B1 * | 12/2011 | Branz et al. | 216/89 |
| 8,119,438 B2 * | 2/2012 | Nishimoto | 438/71 |
| 8,124,535 B2 | 2/2012 | Lin et al. | |
| 8,193,095 B2 * | 6/2012 | Lin et al. | 438/700 |
| 8,334,216 B2 * | 12/2012 | Lin et al. | 438/745 |
| 8,486,843 B2 * | 7/2013 | Li et al. | 438/753 |
| 2002/0068421 A1 | 6/2002 | Yamazaki et al. | |
| 2002/0104552 A1 | 8/2002 | Bay | |
| 2002/0123227 A1 * | 9/2002 | Winningham et al. | 438/700 |
| 2002/0145792 A1 | 10/2002 | Jacobson et al. | |
| 2003/0096113 A1 | 5/2003 | Jacobson et al. | |
| 2003/0119332 A1 | 6/2003 | Kuebelbeck et al. | |
| 2003/0190812 A1 | 10/2003 | Padhi et al. | |
| 2004/0100594 A1 | 5/2004 | Huibers et al. | |
| 2004/0100677 A1 | 5/2004 | Huibers et al. | |
| 2004/0241967 A1 | 12/2004 | Yamazaki et al. | |
| 2005/0056118 A1 | 3/2005 | Xia et al. | |
| 2005/0101153 A1 * | 5/2005 | Matsumura et al. | 438/753 |
| 2005/0130439 A1 | 6/2005 | Goo et al. | |
| 2005/0137531 A1 | 6/2005 | Prausnitz et al. | |
| 2005/0271805 A1 | 12/2005 | Kambe et al. | |
| 2006/0281333 A1 | 12/2006 | Shin et al. | |
| 2006/0281334 A1 | 12/2006 | Shin et al. | |
| 2007/0121205 A1 | 5/2007 | Miles | |
| 2007/0148922 A1 | 6/2007 | Yamazaki et al. | |
| 2007/0152234 A1 | 7/2007 | Yamamoto et al. | |
| 2007/0155021 A1 | 7/2007 | Zhang et al. | |
| 2007/0155022 A1 | 7/2007 | Yamakawa et al. | |
| 2007/0184576 A1 | 8/2007 | Chang et al. | |
| 2007/0190326 A1 | 8/2007 | Perry et al. | |
| 2007/0206267 A1 | 9/2007 | Tung et al. | |
| 2007/0247620 A1 | 10/2007 | Koo | |
| 2007/0281249 A1 | 12/2007 | Tutt et al. | |
| 2009/0026070 A1 | 1/2009 | Fan et al. | |
| 2009/0107545 A1 | 4/2009 | Moslehi | |
| 2009/0147167 A1 | 6/2009 | Park | |
| 2009/0183776 A1 * | 7/2009 | Kwag et al. | 136/261 |
| 2009/0236317 A1 * | 9/2009 | Yost et al. | 216/99 |
| 2009/0293946 A1 * | 12/2009 | Lin et al. | 136/255 |
| 2009/0317934 A1 | 12/2009 | Scherff et al. | |
| 2010/0092888 A1 | 4/2010 | Buchine et al. | |
| 2010/0139763 A1 | 6/2010 | Van Nieuwenhuysen et al. | |
| 2010/0165336 A1 | 7/2010 | Ebstein | |
| 2010/0187123 A1 | 7/2010 | Bocarsly et al. | |
| 2010/0248449 A1 * | 9/2010 | Hildreth et al. | 438/460 |
| 2010/0258177 A1 | 10/2010 | Ko et al. | |
| 2010/0270263 A1 * | 10/2010 | Li et al. | 216/41 |
| 2010/0270650 A1 * | 10/2010 | Li et al. | 257/618 |
| 2010/0296986 A1 | 11/2010 | Feyh | |
| 2011/0003465 A1 | 1/2011 | Scardera et al. | |
| 2011/0030610 A1 | 2/2011 | Kamian et al. | |
| 2011/0045627 A1 | 2/2011 | Sachs et al. | |
| 2011/0143484 A1 * | 6/2011 | Lin et al. | 438/72 |
| 2011/0240997 A1 | 10/2011 | Rockenberger et al. | |
| 2011/0303265 A1 | 12/2011 | Yuan et al. | |
| 2011/0316145 A1 | 12/2011 | Tsao et al. | |
| 2012/0024365 A1 | 2/2012 | Branz et al. | |
| 2012/0088372 A1 * | 4/2012 | Chien et al. | 438/753 |
| 2012/0103825 A1 | 5/2012 | Oh et al. | |
| 2012/0178204 A1 * | 7/2012 | Toor et al. | 438/71 |
| 2012/0225517 A1 * | 9/2012 | Zhang et al. | 438/71 |
| 2013/0052762 A1 * | 2/2013 | Li et al. | 438/22 |

FOREIGN PATENT DOCUMENTS

| | | |
|---|---|---|
| JP | 2005277208 | 6/2005 |
| JP | 2005183505 | 7/2005 |
| JP | 2007305748 | 11/2007 |
| WO | 03105209 | 12/2003 |
| WO | 2005059985 | 6/2005 |
| WO | 2006051727 | 5/2006 |
| WO | 2007083152 | 7/2007 |
| WO | 2007025536 | 8/2007 |
| WO | 2009117642 | 9/2009 |
| WO | 2009209420 | 9/2009 |
| WO | 2011060193 | 5/2011 |
| WO | 2011161479 | 12/2011 |
| WO | 2012121706 | 9/2012 |
| WO | 2013142122 | 9/2013 |

OTHER PUBLICATIONS

Yuan, et al., "Efficient Black Sikocon Solar Cell With a Density-Graded Nanoporous Surface; Optical Properties, Performance Limitations, and Design Rules," Applied Physics Letters vol. 95, Issue 12, Sep. 2009, pp. 123501 (1-3).

Toor et al.,"Multi-Surface Texture to Improve Blue Response of Nanoporous Black Silicon Solar Cells," Applied Physics Letters vol. 99, Issue 10, Sep. 2011, pp. 10103501 (1-3).

Lee, et al., "Extremely Superhydrophobic Surfaces With Micro- and Nanostructures Fabricated by Copper Catalytice Etching," Langmuir Article, vol. 27, Issue 2, Jan. 18, 2011, pp. 809-814.

Huang et al., "Metal-Assited Electrochemical Etching of Silicon," Nanotechnology, vol. 21, Nov. 19, 2010 pp. 465301 (1-6).

Peng et al., "Fabrication of Single-Crystalline Silicon Nanowires y Scratching a Silicon Surface With Catalytic Metal Particles," Advanced Functional Materials, vol. 16, Issue 3, Feb. 2006, pp. 387-394.

Lee et al., "Patterning of Various Silicon Structures Via Polymer Lithography and Catalytic Chemical Etching," Nanotechnology, vol. 22, Issue 27, Jul. 8, 2011, pp. 275305 (1-6).

Liu et al., "Efficient SERS Substrates Made by Electroless Silver Deposition Into Patterned Silicon Structures," Journal of Material Chemistry, vol. 14, Issue 10, Apr. 21, 2004 (1st published on line), pp. 1526-1532.

Tsujino et al., "Texturization of Multicyrstalline Silicon Wafers for Solar Cells by Chemical Treatment Using Metallic Catalyst," Solar Energy Materials & Solar Cells, vol. 90, Issue 1, Jan. 2006, pp. 100-110.

Li et al., "Metal-Assisted Chemical Etching in HF/H2O2 Procedures Porous Silicon," Applied Physics Letters vol. 77, Issue 16, Oct. 2000, pp. 2573-2574.

Nishioka et al., "Antireflection Subwavelength Structure of Silicon Surface Formed by Wet Process Using Catalysis of Single Nano-sized Gold Particle," Solar Energy Materials and Solar Cells, vol. 92, Issue 8, Aug. 2008, pp. 919-922.

Putnam et al., "10um minority-carrier diffusion lengths in Si Wires snythesized by Cu—catalyzed vapor-liquid-solid growth," Applied Physics Letters, vol. 95, Issue 16, Oct. 19, 2009, pp. 163116-1-163116-3.

Kuzuma-Filipek et al., ">16% thin-film epitaxial silicon solar cells on 70-cm2 area with 30-us active layer, porous silicon back reflector, and Cu—based top-contact metallization," Progress in Photovoltaics: research and applications, vol. 20, Issue 3, May 2012, pp. 350-355.

Nishioka et al, "Nano-sized Taper Structure Formed by Wet Process Using Catalysis of God Nanoparticle," School of Material Science, Japan Advanced Institute of Science and Technology, MRS Fall Meeting 2007.

(56) References Cited

OTHER PUBLICATIONS

Koynov et al., "Black multi-crystalline silicon solar cells," Rapid Research Letters, vol. 1, Issue 2, Oct. 2006, pp. R53-R55.
Koynov et al, "Black nonreflecting silicon surfaces for solar cells," Applied Physics Letter, vol. 88, Issue 30, May 2006, pp. 203107-1-203107-3.
Kumaravelu et al., "Surface Texturing for Silicon Solar Cells Using Reactive Ion Etching Technique," Photovoltaic Specialist Conference, 29th IEEE, May 19-24, 2002, pp. 258-261.
PCT/US09/37776 International Search Report and Written Opinion dated Sep. 28, 2009.
PCT/US09/37776 International Preliminary Report on Patentability dated Sep. 21, 2010.
PCT/US13/30257 International Search Report and Written Opinion dated May 16, 2013.
Japanese Application No. 500974/2011 Office Action dated Mar. 13, 2012 with English translation.
Chinese Application No. 200980110274.3 Office Action dated Dec. 25, 2012 with English translation.
Chinese Application No. 200980110274.3 Office Action dated Jun. 27, 2013 with English translation.
Chinese Application No. 200980110274.3 Office Action dated Jul. 10, 2012 with English translation.
Chinese Application No. 200980110274.3 Office Action dated Dec. 11, 2011 with English translation.
Menna et al, "Porous silicon in solar cells: A review and a description of its application as an AR coating," Solar Energy Materials and Solar Cells, vol. 37, Issue 1, Apr. 1995, pp. 13-24.
Li, et al, "Hydrogen generation from photoelectrochemical water splitting based on nanomaterials," Laser Photonics Rev. vol. 4, Issue 4, Jun. 2010, pp. 517-528.
Sai, et al., "Wide-Angle Antireflection Effect of Subwavelength Structures for Solar Cells," Japan Journal of Applied Physics, vol. 46, No. 6A, Jun. 2007, pp. 3333-3336.
Stephens, "Optical Reflectance and Transmission of a Textured Surface," Thin Solid Films, vol. 45, Issue 1, Aug. 1977, pp. 19-29.
Yu, "Fabrication of large area subwavelength antireflection structures on Si using trilayer resist nanoimprint lithography and liftoff," J. Vac. Sci. Technol. B 21, 2874, Dec. 2003.
Chartier et al, "Metal-assisted chemical etching of silicon in HF-H202," Electrochimica Acta, vol. 53, Issue 17, Jul. 2008, pp. 5509-5516.
Kelly, et al, "Design and characterization of a robust photoelectrochemical device to generate hydrogen using solar water splitting," Intl Journal of Hydrogen Energy, vol. 31, Issue 12, Sep. 2006, pp. 1658-1673.
Koshida, et al, "Photoelectrochemical Behavior of n-Type Porous-Si Electrodes," Japanese Journal of Applied Physics, 25, No. 7, Jul. 1986, pp. 1069-1072.
PCT/US10/56417 International Search Report and Written Opinion dated Jan. 25, 2011.
Xiu et al., "Superhydrophobic and Low Light Reflectivity Silicon Surfaces Fabricated by Hierarchical Etching," Langmuir vol. 24, Issue 18, Sep. 16, 2008, pp. 10421-10426.
Yoo et al., "Black silicon layer formation form application in solar cells," Solar Energy Materials & Solar Cells, vol. 90, Issues 18-19, Nov. 23, 2006, pp. 3085-3093.
U.S. Appl. No. 13/825,541 Restriction Requirement dated Oct. 11, 2013.
U.S. Appl. No. 12/053,444 Non Final Office Action dated Sep. 16, 2011.
U.S. Appl. No. 12/053,444 Non Final Office Action dated Apr. 4, 2012.
U.S. Appl. No. 12/053,444 Non Final Office Action dated Nov. 26, 2012.
U.S. Appl. No. 12/053,444 Final Office Action dated Jun. 6, 2013.
PCT/US2011/027479 ISR and Written Opinion dated Jun. 11, 2011.
PCT/US2011/027479 International Preliminary Report on Patentability dated Sep. 10, 2013.

\* cited by examiner

COPPER-ASSISTED, ANTI-REFLECTION ETCHING OF SILICON SURFACES

CROSS-REFERENCE TO RELATED APPLICATIONS

This application is a continuation-in-part of U.S. patent application Ser. No. 12/053,445, filed Mar. 21, 2008, which is incorporated herein by reference in its entirety.

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

Despite numerous attempts at making better solar cells with new and exotic materials, the photovoltaics market is still dominated by early or first generation solar cells that are typically silicon wafer-based solar cells. Most solar cell manufacturers are equipped to produce silicon wafer-based solar cells, and research continues to design silicon-based solar cells that can achieve higher conversion efficiencies without an exorbitant increase in production costs, e.g., the aim of research often is to achieve the lowest cost per watt solar cell design that is suitable for commercial production. In addition to use in solar cells, silicon wafers, other silicon layers on substrates, and objects having silicon surfaces are used in numerous other applications such as in electronic devices, telecommunication devices, computers, and even in biological or medical applications, and these applications have also driven research to methods of fabricating silicon wafers and silicon surfaces with particular qualities or characteristics such as a rough, textured, or nanostructured surface.

The performance of solar cells and other optoelectronic devices is directly related to optical losses caused by high reflectivity. Flat silicon surfaces such as those found on an untreated silicon wafer have a high natural reflectivity across the entire range of the solar spectrum that could otherwise be converted to electrical energy by the silicon photovoltaic device. To produce high efficiency solar cells, researchers have sought ways to minimize reflection losses. One common approach has been to provide anti-reflection coatings (ARCs) that typically are selected based on interference. For example, quarter wavelength transparent layers of materials such as $SiO_x$, $TiO_x$, ZnO, ITO, or $Si_3N_4$ are used as ARCs on silicon surfaces. In some cases, ARCs from oxidized silicon may be formed by electrochemical etching. All such ARC coatings are resonant structures and perform well only in a limited spectral range and for specific angles of incidence while the solar spectrum spans a wide range of wavelengths and the incident angle varies during the day. The typical results achieved with simple one-layer ARCs have been a reduction of the surface reflection to about 8 to 15 percent. With more difficult two-layer ARC coatings, the reflectivity can be reduced to about 4 percent, but this kind of coating is expensive to apply and is not effective when placed under glass in photovoltaic modules.

Researchers have shown that efficient suppression of reflection in a broad spectral range can be achieved by deep surface texturing. In this regard, etching can be used on a smooth or polished silicon surface to produce rough surfaces with bumps and pits having typical sizes of several or even ten micrometers, and these rough surfaces exhibit reduced reflectivity due to the reflection and absorption characteristics. In one example, anisotropic etching of silicon in $KOH/C_2H_5OH$ mixtures produces densely packed pyramids that appear black. However, such etching has been typically limited to single crystalline silicon with <1,0,0,> surface orientation, and solar cell design is made more complex by the large penetration pyramids. This texturing also has reflectivity that increases rapidly with the angle of light incidence.

More recently, researchers determined that a fine surface texturing on the nanometer scale may be utilized to control reflectivity of silicon surfaces. Specifically, a textured surface with features smaller than the wavelength of light is an effective medium for controlling reflectivity, and testing with regard to solar cell applications has shown that a fine texture that is only about 300 to 500 nanometers in depth and provides a gradual grading of the silicon density and of the index of refraction from the surface to the bulk that is adequate to suppress reflectivity of a silicon surface in the usable spectral range of photon energies above the band gap. Such a textured surface may be thought of as a subwavelength structured surface that behaves itself as an anti-reflective surface, with the gradually tapered density of the anti-reflective surface suppressing reflection over a wide spectral bandwidth and over a large incidence angle of the incoming light. One group of researchers has developed a method of nanoscale texturing of silicon surfaces that utilizes wet chemical etching to reduce optical losses due to surface reflection to below 5 percent at all solar wavelengths for crystalline silicon.

Briefly, the texturing of the silicon surfaces involves black etching in a three step process. First, a discontinuous gold (Au) layer with a thickness of about 1 to 2 nanometers is deposited by thermal evaporation or other deposition techniques. This initial metal coating is made up of Au clusters or islands that in later steps provide a catalytic action or function. Second, a wet chemical etching of the silicon material is performed using an aqueous solution of hydrofluoric acid (HF) and hydrogen peroxide ($H_2O_2$). This solution etches clean or non-coated portions of the silicon surface very slowly but near or about the periphery of the Au islands a texture with a depth of up to 500 nanometers forms very quickly, such as at an etch rate of about 330 nanometers per minute (which indicated catalytic action to these researchers of the Au clusters or islands). Third, since gold is a detrimental impurity in silicon surfaces, the remaining gold is removed from the textured silicon surface such as by room temperature etching in an aqueous solution of iodine and potassium iodide. The researchers indicated that this multi-step process including deposition of a metallic or catalytic layer may be performed on different silicon surfaces including morphologies such as crystalline, multicrystalline, and amorphous as well as differing doping such as n-type, p-type, and intrinsic doping. The amount of absorbed light was increased with this black etch treatment and results showed reflectivity of as little as 2 to 5 percent in the high light absorption ranges of the silicon samples.

While such etching processes produce highly non-reflective or "black" silicon surfaces, there are a number of drawbacks that may hinder wide adoption of such processes. The deposition of gold may be cost prohibitive (e.g., undesirably increase the production cost or price of solar cells or other optoelectronic devices). The costs include material costs associated with deposition of the thin layers of pure gold and also include high capital equipment costs associated with the purchase, operation, and maintenance of vacuum deposition and other equipment used in the metallic deposition steps of the process. The process also requires two or more steps to provide the etching or texturing, which increases manufacturing complexity and fabrication times. Hence, there is an unmet demand for inexpensive, less complex (e.g., processes with fewer steps and less equipment), and efficient techniques for etching silicon surfaces including ways to facilitate black etching of silicon wafers.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods that are meant to be exemplary and illustrative, not limiting in scope. In various embodiments, one or more of the above-described problems have been reduced or eliminated, while other embodiments are directed to other improvements.

Prior silicon etching research has shown techniques for producing highly non-reflective or "black" silicon surfaces, but these techniques have generally called for evaporating or depositing a thin layer of expensive metals or islands of such metals, such as a 1 to 3 nanometer (nm) layer of gold, upon the silicon surfaces. Then, etching would be performed in a separate step such as by placing the coated silicon surface in an aqueous solution of hydrofluoric acid (HF) and hydrogen peroxide ($H_2O_2$) to texture the surface to make a density gradient at the surface with length scales that are less than the wavelength of light. Other techniques have involved providing nanoparticles of catalytic metals such as gold or silver as a coating layer or in a suspension that is added to the etching solution along with the HF and $H_2O_2$. Such techniques have helped eliminate complex deposition steps but may still be too costly as they specify the use of evaporated gold or other relatively expensive metal nanoparticles as a catalyst for the etching process.

An embodiment of the etching process described represents a unique process as it eliminates the need for deposition of gold or other metals on a silicon surface and the use of gold or other catalytic metal nanoparticles while still providing a black etching process that is extremely effective in achieving reduced reflectance, is less expensive to implement and perform, and, in some cases, is more controllable. More particularly, the etching process provides molecular or ionic species containing a catalytic metal, such as gold, silver, a transition metal, or the like, in the etching solution along with oxidant-etchant solution components such as an etching agent and an oxidizing agent. The catalytic metal molecule or ion acts to catalyze the reaction caused in part by the oxidant-etchant solution (e.g., HF and $H_2O_2$), and the resulting etching is very uniform and produces a rapid formation of a non-reflective or a black surface layer on the silicon surface. During the etching step or process, stirring or agitation is also performed to facilitate the texturing, e.g., ultrasonic agitation or sonication is used to stir the etching solution.

In one exemplary, but not limiting, implementation of an etching process, catalytic quantities (e.g., between about 70 and 400 μM) of chloroauric acid ($HAuCl_4$) in aqueous solution are mixed, such as 1:1 or in other useful ratios, with a oxidant-etchant solution (e.g., 5 to 10% of an etching agent such as HF and 15 to 30% of an oxidizing agent such as $H_2O_2$, with one experiment using about 6% HF and 18% to 27% $H_2O_2$). The chloroauric acid in this implementation is the source of the catalytic metal molecule or ionic species or the ionic metal solution (or, more simply, the "catalytic solution"). A silicon wafer or a substrate with a silicon surface is placed in the etching solution containing the ionic metal solution and the oxidant-etchant solution, and the etching solution is agitated or stirred for an etch period (e.g., up to about 4 minutes or more using ultrasonic agitation, such as 125 W in a total solution of 10 ml for a 1 square inch wafer). The result of such etching is a textured surface with extremely low reflectivity across the broad spectrum of wavelengths useful for solar energy applications. The silicon etching may be used on a variety of surface types such as <1,0,0>, <1,1,1>, <3,1,1>, and other surfaces of silicon, and on multi-crystalline wafers with grains that may expose silicon surfaces to the etching solution. Post etching treatment may be performed with a stripping solution (e.g., $I_2$/KI or the like) to remove residual catalytic metals such as gold from the surface, and this typically has not detrimentally affected reflectivity.

In one exemplary, but not limiting, embodiment, a method is provided for texturing a silicon surface. The method includes positioning a substrate, such as a silicon wafer, with a silicon surface into a vessel. The vessel is filled with a volume of an etching solution to cover the silicon surface. The etching solution includes a catalytic solution and a oxidant-etchant solution, e.g., an aqueous solution of HF and $H_2O_2$. The catalytic solution may generally be any solution that provides a source of metal-containing molecules or ionic species of catalytic metals (such as a transition metal or the like). The method continues with etching the silicon surface by agitating the etching solution in the vessel such as with ultrasonic agitation for a relatively short time period such as less than about 4 minutes with 30 to 90 seconds being adequate to achieve a desired surface roughening in some cases. During the etching step, the catalytic solution in the presence of the oxidant-etchant solution provides or releases a plurality of metal particles. In some cases, the catalytic solution is a dilute solution of $HAuCl_4$, and the metal particles are gold particles and/or nanoparticles. In other cases, the catalytic solution comprises a dilute solution of AgF and the metal particles are silver particles and/or nanoparticles. In other cases, the molecules or ionic species may directly affect the catalysis. In other cases, the metal particles are transition metal particles, and, in some applications, the etching is performed until the etched silicon surface has a reflectivity of less than about 10 percent in a wavelength range of about 350 to 1000 nanometers.

In other cases, though, it may be useful to alter the metal chemistry to use metals other than gold or silver. For example, etching methods may utilize copper (Cu) nanoparticles to etch or produce nanoporous silicon (Si) that results in anti-reflection, and such etching may be thought of as Cu-assisted etching. The applicants' work with such Cu-assisted etching has been demonstrated to produce a textured or nanoporous surface on a Si substrate with significantly reduced reflection such as about 3% reflectivity of nanoporous Si using Cu as the catalyst. Further, it has been demonstrated that a solar cell can be fabricated using such Cu-assisted nanoporous Si to achieve a conversion efficiency of at least about 17%, with other desirable solar cell characteristics such as, but not limited to, a short-circuit current density, $J_{sc}$, of 36.6 mA/cm², an open-circuit voltage, $V_{oc}$, of 616 mV, and a fill-factor, FF, of 75.4%.

During development of the Cu-assisted etching method, several factors or process parameters were identified as useful for producing quality or desirable AR or textured Si surfaces. During the etching process, it is preferable to control the ratio of hydrofluoric acid (HF) to hydrogen peroxide ($H_2O_2$) molar concentrations, which may be defined as rho ($\rho$) with $\rho$ equaling the molar concentration of HF divided by the sum of molar concentrations of HF and $H_2O_2$ (i.e., $\rho=[HF]/([HF]+[H_2O_2])$). Cu-assisted etching, with $\rho$ above about 70 percent, HF volume concentration of 10 percent or higher (in some cases), and high concentrations of HF and $H_2O_2$ with little dilution in water, results in a spectrum-weighted reflection of around 3 percent with $\rho$ at or above 74 percent. In comparison, an Au-assisted etch may require a $\rho$ around 36 percent and Ag-assisted etch may require a $\rho$ around 92 percent.

Cu-assisted etching is also improved or facilitated by use of concentrated HF and $H_2O_2$ to ensure that the etch mixture is not highly diluted in water. Further, it is typically desirable to control the ratio of Cu nanoparticle to spacing (size/spacing) provided on the Si surface prior to the etching step. Cu nanoparticle size and spacing determines the configuration of the nanoporous Si structure produced with the Cu-assisted etching and the resulting low reflectivity. In one exemplary but non-limiting example, the Cu nanoparticle size was chosen to be at least about 20 nm, and the spacing was chosen to be at least about 5 nm (e.g., a size to space ratio of at least about 4) to achieve a useful AR coating on a Si substrate. With these parameters/factors controlled, a solar cell can readily be fabricated using a Cu-assisted nanoporous black Si etch to prepare the silicon substrate. For example, high efficiency solar cells may be obtained through the use of Cu-based nanoporous black silicon that includes a diffused junction emitter.

In some applications, the use of Cu as a metal to etch nanoporous Si has advantages over using Ag or Au. Cu is significantly cheaper than Ag and Au. Additionally, Cu is a metal that is already used extensively in commercial Si microfabrication facilities such that its further use in the etching processes described herein is likely compatible with existing industrial technologies. A nitric acid wash may be used to readily dissolve away the copper nanoparticles prior to use of the textured Si substrate in a solar cell. Further, in the context of related work on Si-based solar cells, Cu impurities within the silicon has proven to be less detrimental to the Si solar cell performance than Au and Ag such that post-etching processing to remove all residual Cu impurities, introduced by etching, from the nanoporous Si surface is not as critical to achieving a desirable Si substrate as is the removal of Au and Ag impurities.

In such Cu-assisted applications, a method may be provided for texturing a silicon surface. The method may include positioning a substrate with a silicon surface in a vessel, with the silicon surface having a plurality of deposited copper particles or a coating of copper particles attached to the surface but not completely covering the surface. The method further may include filling the vessel with a volume of an etching solution that covers the silicon surface of the substrate. The etching solution may include an oxidant-etchant solution that comprises an etching agent and a silicon oxidizing agent. The method further may include etching the silicon surface by agitating (e.g., ultrasonic agitation or sonication) the etching solution in the vessel.

In some cases, the method may include, prior to the positioning of the substrate in the etching vessel, performing electroless deposition to deposit the copper particles on the silicon surface. The deposition may be performed such that the copper particles have a size less than about 28 nm (such as about 20 nm), and the electroless deposition may further be performed/controlled to provide a ratio of particle size to particle-to-particle spacing on the silicon surface in the range of 3 to 5 (e.g., a spacing 5 nm when the Cu is provided as 20 nm particles). The electroless deposition may be carried out to provide particle-to-particle spacing on the silicon surface in the range of 3 to 8 nanometers. A concentration of the etching agent (e.g., HF) may be at least about 10 percent of the total volume of the etching solution while a concentration of the oxidizing agent (e.g., $H_2O_2$) is at least about 2 percent.

In some texturing processes, the etching is performed until the etched silicon surface has a reflectivity of less than about 5 percent in a wavelength range of about 350 to about 1000 nanometers (e.g., about 3 percent is provided with Cu-assisted etching in test cases). Some implementations may use HF as the etching agent and one of $H_2O_2$, $O_3$, $CO_2$, $K_2Cr_2O_7$, $CrO_3$, $KIO_3$, $KBrO_3$, $NaNO_3$, $HNO_3$, and $KMnO_4$. For example, the silicon oxidizing agent may be $H_2O_2$, and desirable texturing is achieved when the etching solution has a value of rho ($\rho$) of at least about 70 percent, with $\rho$ being defined as a molar concentration of HF divided by a sum of the molar concentrations of HF and $H_2O_2$. In some cases, during the etching of the silicon surface, the etching solution is heated to a temperature in the range of 30 to 50° C., and the etching may be performed for a time period of a length chosen such that the etching creates a plurality of tunnels in the silicon surface having a depth greater than about 200 nanometers (and typically less than about 500 nanometers).

In addition to the exemplary aspects and embodiments described above, further aspects and embodiments will become apparent by reference to the drawings and by study of the following descriptions.

BRIEF DESCRIPTION OF THE DETAILED DRAWINGS

Exemplary embodiments are illustrated in referenced figures of the drawings. It is intended that the embodiments and figures disclosed herein are to be considered illustrative rather than limiting.

DESCRIPTION

Figure 1:
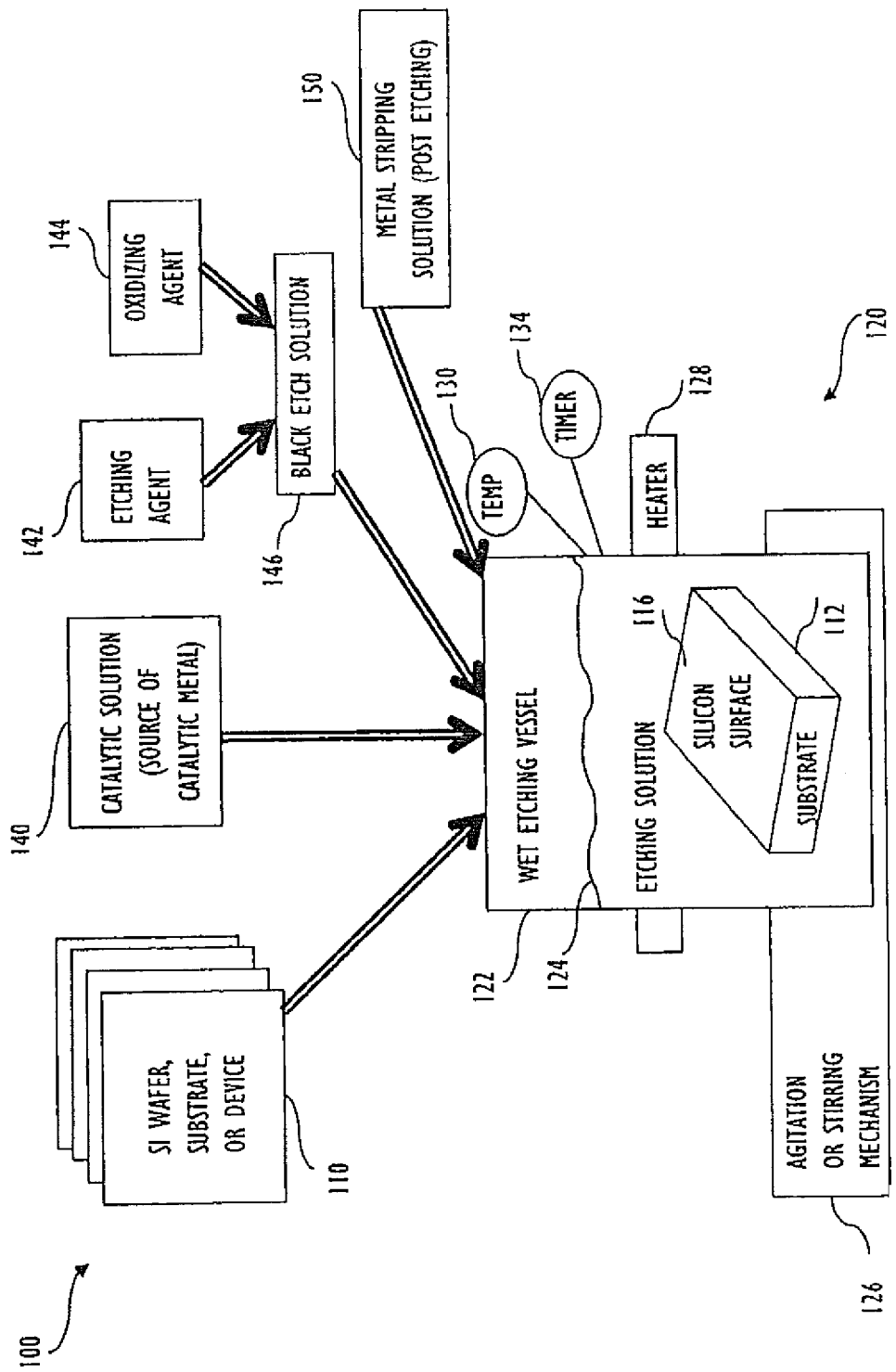
FIG. 1 illustrates in schematic and/or functional block form of an etching system for use in texturing silicon surfaces using catalytic solutions, with catalytic metal molecules or ionic species of catalytic material, and a oxidant-etchant solution.

The following provides a description of exemplary methods and systems for etching or texturing silicon surfaces such as to create a surface of tapered density to significantly reduce reflectivity (e.g., to create an anti-reflective surface on a silicon wafer that may be used in a solar cell). Initially, the methods and systems are described by using a source of a catalytic metal to provide gold or silver nanoparticles to assist in the etching or texturing process with reference to FIGS. 1-7.

This discussion is then followed with a differing approach to providing a metal-assisted chemistry for producing anti-reflection etching of silicon. As discussed above toward the end of the Summary section, it was recognized that silicon substrates can be effectively etched using Cu nanoparticles, and the Cu-assisted etching with electroless Cu deposition can provide a nanoporous or textured Si substrate surface with low reflectivity (e.g., less than about 5 percent such as about 3 percent). Prior to this work, many in the field considered copper undesirable for such a use because it was thought to be thermodynamically unfavorable when compared with metals such as gold and silver. Previous metal-assisted etching with copper at conditions different from the etching conditions described herein did not result in low reflectivity surfaces.

As it was predicted that Cu could not effectively be used for obtaining nanoporous black Si, others were discouraged from using copper and developing the chemistry for Cu-based nanoporous etching of Si for anti-reflection surfaces. The use of Cu to make anti-reflection surfaces first required a recognition that despite such predictions and understandings copper nanoparticles might be useful in a metal chemistry to provide etching of silicon. However, developing a useful metal chemistry and Cu-assisted etching process was not trivial and may have only been achieved through the applicants' systematic study, which helped determine an exemplary chemistry for obtaining Cu-based nanoporous black Si.

In a Cu-assisted etching experiment, various combinations of hydrogen peroxide ($H_2O_2$), hydrofluoric acid (HF), and deionized water ($H_2O$) were tested in terms of $\rho$, HF, and $H_2O_2$ volume concentration. For example, in one series of tests, the volume of $H_2O_2$ was kept or set at 1.5 ml and the volume of $H_2O$ was set at 50 ml, and then the volume of HF was varied from 0.25 ml ($\rho\sim 22\%$, HF 0.5% of total volume, and $H_2O_2$ 3% of total volume) to 8 ml ($\rho\sim 90\%$, HF 14% of total volume, and $H_2O_2$ 2.5% of total volume). Cu nanoparticles were electrolessly deposited for 1-minute on HF cleaned planar (100) p-type float-zone (FZ) Si substrates (e.g., using a recipe such that shown by J-P. Lee et al., Langmuir Vol. 27, pages 809-814, 2011, which is incorporated herein by reference). The Cu nanoparticle covered samples were then placed in a $H_2O_2$:HF:$H_2O$ solution for 5 minutes at 50° C. with continuous mixing of the solution. In this test, for $74\%\leq \rho \leq 90\%$, $5\%\leq HF\%$ volume, and $1\%\leq H_2O_2\%$ volume$\leq 3\%$, the spectrum weight reflection, $R_{ave}$, remained in the range of 3 to 4%. This reflectivity result provides a relatively good anti-reflection surface (or Si substrate) and is comparable to what is obtained using Ag or Au catalysts. SEM (scanning electron microscopy) analysis of the nanoporous Si suggests that with increasing HF concentration the pore density and depth increases, which results in an efficient density grade by a mechanism.

Now, with regard first to use of gold and silver, the etching methods include positioning a silicon surface in a volume of etching solution that is made up of an oxidant-etchant solution (e.g., an aqueous solution of an etching agent and an oxidizing agent such as HF and $H_2O_2$) and a source of a molecule or an ionic species that contains a catalytic metal (e.g., an acid such as chlorauric acid in aqueous solution to provide gold in the etching solution or AgF in aqueous solution to provide silver and so on). The bath or volume of etching solution is stirred or agitated for a period of time (or an etch time) to achieve a desired amount/depth of texturing of the silicon surface, which may be thought of as forming a non-reflective layer or textured layer on the silicon surface. The gold or other metal catalyst is then cleaned or stripped from the silicon surface, and then the silicon surface or a wafer or substrate with such surface may be used to fabricate a device such as a solar cell, a biomedical device, an optoelectrical component, or the like.

The etching method described herein provides a solution-based approach to etching silicon that may use inexpensive chemicals (e.g., a reaction based on catalytic quantities of ionic or molecular-compound forms of gold, platinum, silver, or other catalytic metals in an oxidant-etchant solution is very inexpensive to create). The etching method is "one-step" rather than multi-step in the sense that etching occurs in the presence of the oxidant-etchant solution and the metal ionic or molecular solution as these experience ultrasonic or other agitation. The etching method is advantageous in part because of its simplicity and speed, with etch times being relatively short and not requiring deposition/coating pre-etching. The etching method is also desirable as it produces textured silicon surfaces with low reflectivity over a broad spectrum, and these non-reflective layers or textured silicon surfaces have a wide acceptance angle of anti-reflection. Further, the etching method(s) is applicable to nearly all surfaces of silicon including multi-crystalline silicon. As will be seen, the resulting silicon surfaces are likely to be highly desirable in the photovoltaic or solar cell industry. For example, the etching method, with $HAuCl_4$ provided as or as part of the catalytic solution, has been used on <1,0,0> crystal silicon wafers with the reflectivity ranging from about 0.3% at a wavelength of 400 nm to about 2.5% at a wavelength of 1000 nm, with most of the usable solar spectrum below 1% reflectivity. When the catalytic solution included AgF, the etching solution technique was able to obtain reflection of less than about 5% on 100 crystal silicon wafers.

As will become clear, numerous catalytic solutions or sources of catalytic metals may be used to practice the etching process. One embodiment uses a catalytic solution chosen to provide molecular or ionic species of gold (e.g., chlorauric acid ($HAuCl_4$) in aqueous solution) while another exemplary embodiment uses a catalytic solution (e.g., a solution with AgF) to provide molecular or ionic species of silver. Generally, the molecular or ionic species or a catalytic solution containing such catalysts is mixed with an etchant such as HF or the like and also with an oxidizing agent such as $H_2O_2$ or the like. In other embodiments, the catalytic solution may be chosen to provide molecules and/or ionic species of other metals such as transition and/or noble metals in the etching solution such as platinum or the like, and this may be useful in further reducing the cost of etching and may be desirable as some of these metals may have less deleterious impurities in silicon than gold.

Generally, the silicon surface is a polished surface, but in some cases, the etching techniques may be performed in combination with other anti-reflection techniques. For example, the silicon surface may be an anisotropically pyramid-textured Si <1,0,0> surface (or other textured Si surface) that is then treated with a one step etching process by placing the Si <1,0,0> surface (or a substrate/wafer/device with the Si surface/layer) in an etching solution including a catalytic solution (with a metal-containing molecule or an ionic species of a catalytic metal), an etching agent, and an oxidizing agent. Used independently or with other surfacing processes, the etching solution is stirred or agitated for a period of time (e.g., a predetermined etch time) such as with ultrasonic agitation or sonication.

The following description stresses the use of catalytic solutions in etching silicon surfaces for use in controlling (i.e., reducing or minimizing) reflectance, but the etching techniques described herein may be used for texturing silicon for nearly any application in which it is desirable to provide a silicon surface with a particular surface roughness or non-smooth topology such as optoelectronic devices, biomedical devices, and the like. The description begins with a general overview of the etching process with reference to FIGS. 1-3. Then with reference to FIG. 4, the description provides an example of one device, i.e., a solar cell, that can be formed with a silicon substrate or wafer with an antireflective surface created by the explained texturing methods. Next, the description provides a discussion of exemplary recipes (e.g., proportions of and particular types of catalytic solutions and the catalytic metals these solutions may provide, etching agents, oxidizing agents, silicon surfaces, agitation methods, etching times, and the like), processes, and the like to achieve useful results particularly with an eye toward reducing or nearly eliminating reflectance to increase efficiency of a solar cell (e.g., increase photon absorption in photovoltaic devices of silicon).

FIG. 1 illustrates a texturing or etching system 100 of one embodiment. The system 100 includes a source of or quantity of wafers, substrates, or devices 110 with silicon surfaces. These may be Si wafers that are to be used in solar cells, optoelectronics, or other products. The silicon surface 116 on silicon sample 112 may be mono-crystalline, multi-crystalline, amorphous, or the like, and the type of doping may be varied such as to be n or p-type doping of varying levels (such as from about 0.25 ohm-cm to about 50 ohm-cm or the like). The wafer, substrate, or device 110 may have one silicon surface or two or more such surfaces that will be etched during operation of system 100. The system 100 does not require a metal deposition station, but, instead, the system 100 includes an etching assembly 120 with a wet etching vessel or container 122. During operation, one or more of the Si wafers 110 or Si layers on substrate 112 are placed into the vessel 122 before or after adding a volume of an etching solution 124. In FIG. 1, a single substrate 112 is shown in the vessel with an exposed silicon surface 116 but, of course, a plurality of such surfaces 116 may be etched concurrently.

The assembly 120 includes a mechanism 126 for agitating or stirring the solution 124 initially and/or during etching. The mechanism 126 may be a mechanical or magnetic-based stirring device while in some cases enhanced or more repeatable results are achieved with an ultrasonic agitator for stirring/agitating reactants or solutions such as etching solution 124 by sonication. The assembly 120 may include a heater 128 to maintain or raise the temperature of the etching solution 124 within one or more desired temperature ranges to facilitate etching of surface 116. A temperature gauge or thermometer 130 may be provided to monitor the temperature of the solution (and, optionally, provide control feedback signals to heater 128), and a timer 134 may be disclosed to provide a visual and/or audio indicator to an operator of the assembly 120 regarding an etching or stripping step.

The system 100 further includes a catalytic solution 140 that provides a supply or source of a catalytic metal such as a metal containing molecules or ionic species of a catalytic metal. This source provides a quantity of catalyst for the etching solution 124 such as a quantity of a transition or noble metal such as gold, silver, platinum, palladium, copper, nickel, cobalt, and the like. Good results are typically achieved with solutions containing $HAuCl_4$, $AgF$, and the similar acids or materials that release metal-containing molecules or ionic species of such metals when mixed with the oxidant-etchant solution in the etching solution 124 in vessel 122. Generally, this catalytic solution with a metal catalyst is added to the vessel 122 to make up a portion of the etching solution 124, but, in other cases, the solution (or other source of metal-containing molecules or an ionic species of a catalytic metal) 140 is first added to the oxidant-etchant solution 146 (or to one of its components 142, 144) prior to insertion into the vessel 122 with the Si substrate 112. Specific, catalytic solutions and their makeup are discussed in further detail below.

To achieve etching of the silicon surface 116, the system 100 includes a source etching agent 142 and oxidizing agent 144. These are chosen specifically for texturing/etching of silicon, and the etching agent 142 may be HF, $NH_4F$, or a similar etchant. The oxidizing agent may be $H_2O_2$ or another agent such as one that has its decomposition catalyzed by the metal provided by catalytic solution 140. For example, the oxidizing agent 144 may include $H_2O_2$, $O_3$, $CO_2$, $K_2Cr_2O_7$, $CrO_3$, $KIO_3$, $KBrO_3$, $NaNO_3$, $HNO_3$, $KMnO_4$, or the like or a mixture thereof. These agents (or solutions thereof) 142, 144 may be added separately to the vessel 122 to form the etching solution 124 along with the catalytic solution 140 or, as shown, a oxidant-etchant solution 146 may be formed first by combining the etching agent 142 and the oxidizing agent 144 and then putting this solution in the vessel 122. The assembly 120 is then operated such as by agitation via mechanism 126 and heating by heater 128 for a time period ("etch time") to texture the surface 116. After the etch time elapses, the solution 124 is removed (or substrate 112 is moved to another container or vessel for metal stripping), and the remaining metal catalyst is removed as it is likely to present an undesirable impurity in silicon. To this end, the system 100 includes a source of a metal stripping solution 150 that is added to the vessel 122, and the stripping solution may be stirred or agitated (and, optionally, heated with heater 128) by mechanism 126 until all or substantially all of the metal from solution 140 is removed from surface 116. The substrate or wafer 112 may then be used as-is or as a component or layer of a larger device such as a solar cell or photovoltaic device, an optoelectric device, a biomedical device, or the like.

Figure 2:
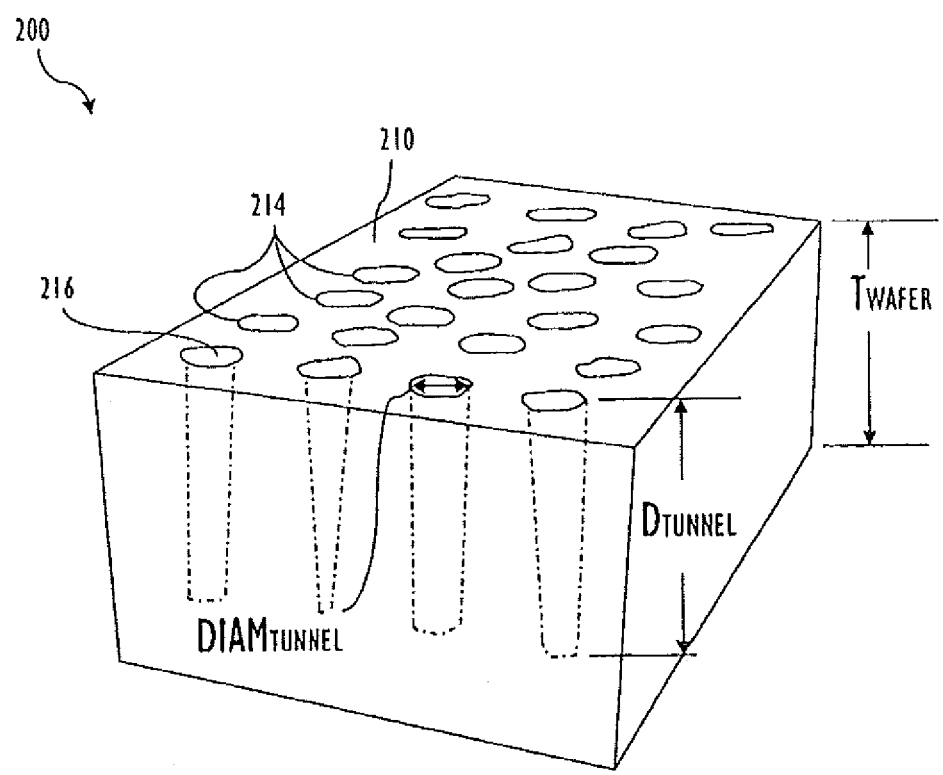
FIG. 2 illustrates a silicon wafer or substrate after etching with an etching solution including catalytic and oxidant-etchant solutions showing a textured silicon surface with a plurality of etched tunnels or pits.

FIG. 2 illustrates a silicon wafer 200 after treatment of an etching process as described herein. As shown, the wafer 200 includes an upper surface or Si surface 210 that has been exposed to an etching solution for a period of time or an etch time. The Si surface 210 has nanoscale roughening that significantly reduces reflectivity. Significantly, the use of catalytic solutions as described herein is believed to act to produce nanoparticles of gold, silver, or other metal that in situ or in the etching solution (such as 2 to 30 mm gold particles, 2 to 30 nm silver particles, or the like depending on the makeup of the catalytic solution) cause the surface 210 to have a plurality of pits or tunnels 214 where etching has occurred much more rapidly due to the presence of a nanoparticle (not shown in FIG. 2). Other mechanisms may be fully or partially responsible for the etching results achieved with the use of the catalytic solutions in combination with the oxidant-etchant solution. Regardless of the acting mechanism(s), each tunnel 214 includes an opening 216 at the surface 210 with a diameter, $Diam_{Tunnel}$, and a depth, $D_{Tunnel}$, that is typically less (e.g., up to about 99.91% less) than the thickness, $t_{wafer}$, of the wafer 200, about 300 micrometers. For example, the tunnel diameters, $Diam_{Tunnel}$, may be somewhat larger than the particle size such as about 21 to about 23 nm when 5 to 10 nm nanoparticles are present in the etching solution. The tunnel depths, $D_{Tunnel}$, may be selected to provide a desired physical characteristic (e.g., an interference with reflection). In the case of controlling reflectance by the silicon layer 210, the tunnel depths, $D_{Tunnel}$, may be between about 50 and about 300 nm (e.g., with one test showing tunnels in the 250 to 280 nm depth range being useful). In practice, a desired depth may be selected or achieved by controlling time and temperature for a particular etching solution. As can be seen from FIG. 2, the etching processes involving catalytic solutions that provide a source of catalytic metal (and, in some cases, nanoparticles of such metals) are effective in providing a nanoscale roughness or structure with tapered density that is desirable for reducing reflectivity.

Figure 3:
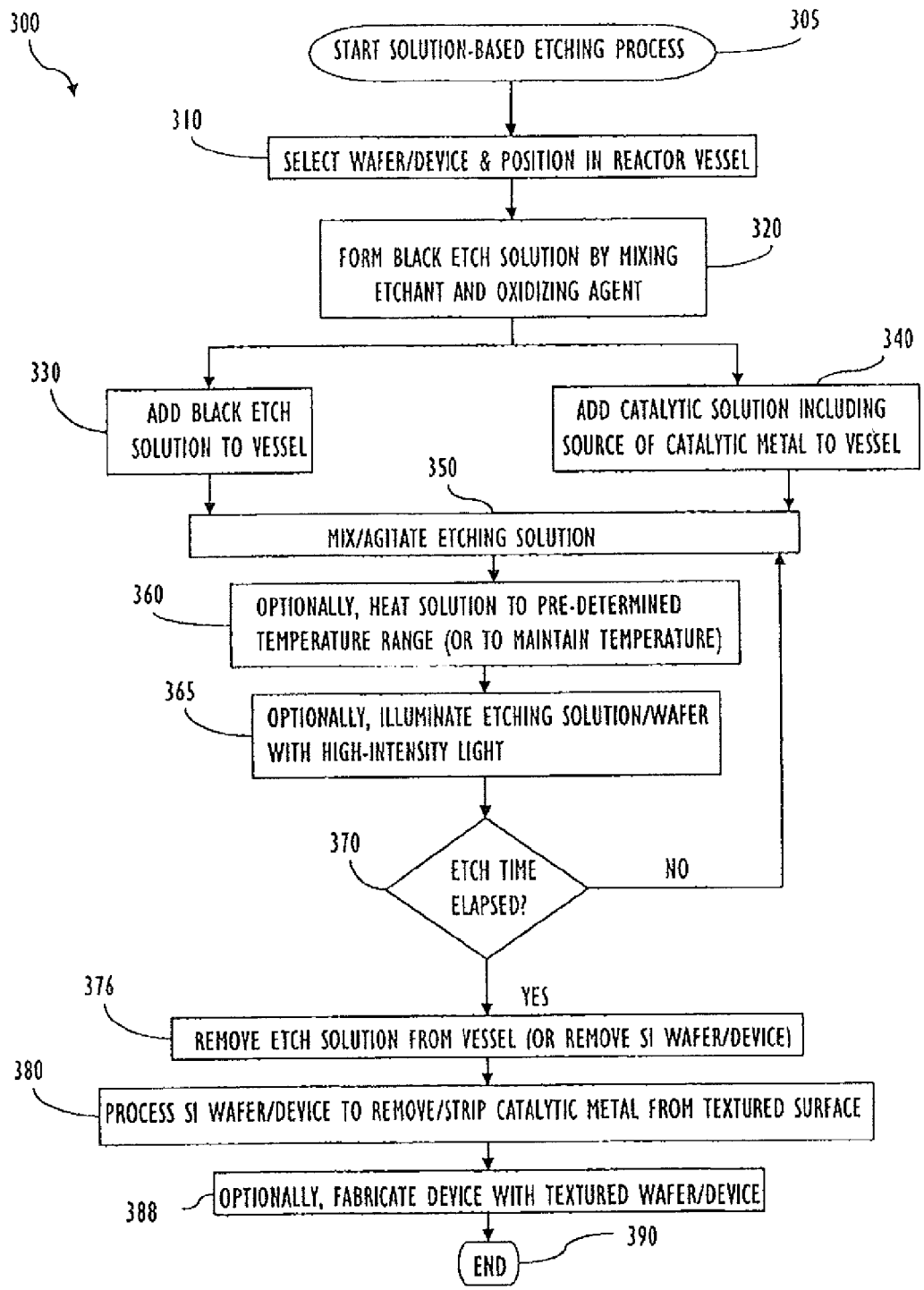
FIG. 3 is a flow chart of an exemplary texturing or etching process using catalytic solution combined with a oxidant-etchant solution to texture a silicon surface.

FIG. 3 illustrates one embodiment of a solutions-based etching or texturing process 300 for processing a silicon surface to obtain a desired characteristic such as, but not limited to, a tapered surface that reduces reflectance or creates a black surface. The process 300 begins at 305 such as with planning or selecting the type of silicon surface to be textured, e.g., a silicon wafer or a substrate or device with a silicon layer and a silicon surface, a particular crystalline surface or makeup, and a particular type of doping. Step 305 may also include choosing a recipe or step-by-step design for the texturing or etching of the silicon surface, and this may include choosing a catalytic metal and sources of molecules or ionic species of such a metal, an etching agent for the silicon surface (e.g., HF or the like) and an oxidizing agent (e.g., $H_2O_2$, $O_3$, $CO_2$, $K_2Cr_2O_7$, or the like), the ratio of each of these to provide in the oxidant-etchant solution that includes these two ingredients, the type and amount of agitation/stirring, the desired depth of surface penetration to provide with the etching, and the time and temperature for etching (which, of course, will vary based on the prior decisions/parameters).

The texturing/etching method 300 continues at 310 with the wafer(s) (or substrates/devices) with the silicon surface being chosen and then positioned into a reaction or etching vessel. At 320, an oxidant-etchant solution is formed by combining or mixing the chosen etching and oxidizing agents (or solutions thereof), but, in some embodiments, this step is not performed and these two agents are simply added to the vessel concurrently or nearly so. The method 300 continues with the performance of steps 330 and 340, which may be performed concurrently or nearly so such as within a preset time period (e.g., less than about 5 minutes or more typically less than about 2 minutes between performance of each step) with either being performed first. At 330, the oxidant-etchant solution is added or input into the vessel with the silicon surface, and at 340, a catalytic solution is added to the vessel (such as an acid or an aqueous solution of an acid that acts as a source of molecules containing (or ionic species of) gold, silver, platinum, palladium, copper, cobalt, nickel, another noble or transition metal, or another catalytic metal/material). In some cases, the particles are provided "dry" or in similar form while in other cases metal-containing molecules (or materials that provide such molecules or ionic species in the presence of the oxidant-etchant solution) are contained in deionized water or aqueous solution and a volume of such solution is added to the vessel at 340.

At 350, the method 300 includes mixing or agitating the etching solution in the vessel such as with mechanical mixing devices or, more typically, with ultrasonic mixing technologies or sonication. At 360, the method 300 may optionally include heating the solution in the vessel to a predetermined temperature range (or adding heat to maintain the initial temperatures of the oxidant-etchant solution in a desired temperature range) chosen to hasten etching processes. At 365, the method 300 may include illuminating the etching solution and/or the wafer or silicon surface with light to facilitate or drive the etching reactions/processes. For example, particular silicon surfaces, such as deeply n-doped surfaces, may benefit from being illuminated under a high-intensity light, which may reduce the etching time (such as to 8 minutes or less in some cases and enhance reflectivity results such as to less than about 5% reflectance where 20 to 30% was achieved without providing intense lighting). At 370, the method 300 involves determining whether a preset etch time has elapsed (e.g., a time determined previously through testing to provide a desired depth or amount of etching based on the silicon surface type, the catalytic metal, and the oxidant-etchant solution composition). If not, the method 300 continues at 350.

If the etch time has elapsed, at 370, the method 300 includes removing the etch solution from the vessel or removing the Si wafer(s) from the vessel at 376. At 380, the catalytic metal is removed from the now textured silicon surface such as with use of a stripping solution selected based on the composition of the catalytic solution (e.g., a differing stripping solution may be used for gold, for silver, for platinum, and the like). At 388, the method 300 may include further processing of the textured wafer to fabricate a device that makes use of the textured/etched silicon surface such as a solar cell, a biomedical device, an optoelectrical device, a consumer electronic device, or the like. At 390, the method 300 is ended (or repeated by returning to step 305 where the same method may be repeated or changed such as to use one of the differing "recipes" described herein).

As discussed above, one reason it may be desirable to etch a silicon surface according to the processes described herein is to form a silicon substrate for use in forming a silicon-based solar cell with little or no total reflectance (e.g., without the need for application of an ARC or further processing). It will be understood that nearly any type of solar cell design may make use of the etching processes, and the description is intended to be broad enough to cover a wide variety of solar cells with varying design. However, at this time, it may be useful to at least describe one useful non-limiting solar cell arrangement and to follow this with a brief discussion of one useful fabrication technique, and these descriptions may then be used to fabricate solar cells and other devices with silicon surfaces textured as described herein.

Figure 4:
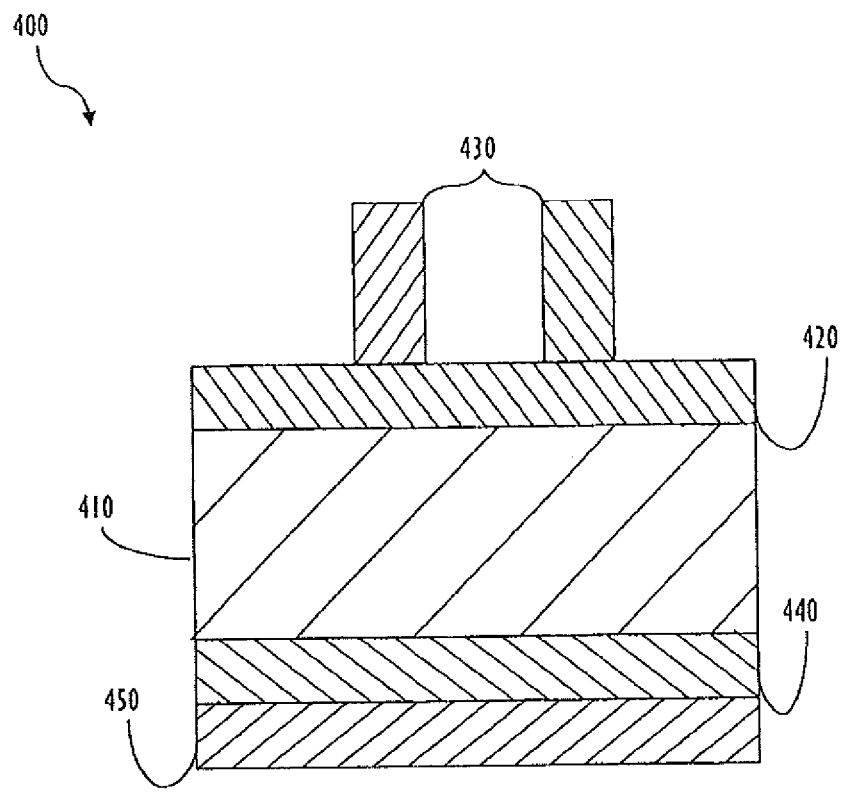
FIG. 4 is a sectional view of a solar cell fabricated with a silicon layer textured with catalytic metals such as with the system of FIG. 1 and/or the process of FIG. 3.

FIG. 4 illustrates a relatively simple solar cell 400. As shown, the exemplary solar cell 400 includes a silicon substrate 410 with at least an upper surface that has been textured or roughened with a catalytic nanomaterial-based etching process (such as using the system 100 of FIG. 1 or the method 300 of FIG. 3) as described herein. The reflectance of substrate may be controlled to be under about 20 percent, more typically less than about 10 percent, and in many cases in the range of about 0.3 to 2.5 percent or up to about 5 percent or more by such techniques. The substrate 410 may be, for example, a Boron-doped, p-type silicon surface or nearly any other silicon surface useful in solar cells. In such a case, the cell 400 may further include an n-type emitter layer 420 provided on the textured or upper surface of the silicon substrate 410. A plurality of electrical contacts (e.g., silver or other contact material) 430 may be positioned on the emitter layer 420, and the cell 400 may further include additional layers/components to provide a desired functionality such as a back surface field layer 440 (e.g., an aluminum or similar metal layer) and a contact layer 450 (e.g., an aluminum or similar material layer). The silicon substrate 410 with an etched surface may take many forms such as an edge-defined film fed grown (EFG) silicon wafer, string ribbon silicon, float zone (FZ) silicon, Czochralski (CZ) grown silicon, cast multi-crystalline silicon (mc-Si), a monocrystalline silicon, epitaxially grown silicon layer, or another silicon structure or type.

In some cases, formation of a solar cell from a textured/etched silicon wafer may involve the following or other processes known to those skilled in the art. Formation of an emitter may involve the diffusion of phosphorus or similar material through the etched surface (e.g., from a spin-on dopant). The doping source may be removed by further etching in concentrated HF or the like, and the result of the diffusion may be the formation of n-type regions. Surface passivation may be provided by oxidizing (e.g., with $O_2$) and annealing (e.g., with $N_2$), which may provide a dry oxide layer with an annealed interface to the silicon to reduce the surface recombination at the heavily doped emitters. A back contact may then be formed by removing the passivating oxide from the back surface of the silicon wafer or substrate and then applying a layer of aluminum or other similar metal and a silver or similar metal onto these back surfaces such as by vacuum evaporation or the like. Next, a front contract grid may be formed such as by opening an array of slits in the passivating oxide on the front or textured surface side of the wafer/substrate and then covering these slits with Ti or the like such as by vacuum evaporation and lift-off of photoresist. The solar cell may be further processed or be assembled with other cells to make solar modules, which in turn may be linked to form photovoltaic arrays. Of course, this is just one simplified method of fabricating a solar cell and it may be modified to form a cell with a black etched surface described herein or other techniques well known in the industry may be used in its place.

The applicants have performed numerous experiments with differing catalytic nanomaterials, oxidant-etchant solutions, and silicon surface types/dopings and have also tested resulting surfaces for reflectivity. The following discussion describes these experiments and the applicants' findings as well as more general conclusions and extensions of their ideas. The process described herein is generally a wet-chemical method that is particularly well suited for producing silicon surfaces that exhibit nearly complete suppression of reflectivity in the wavelength range of 350 to 1000 nm. The processes described herein are believed useful with many silicon substrates such as single-crystal p-type Czochralski, {<1,0,0,> and <1,1,1,>}, n and p-type Float Zone, intrinsic, n and p-doped amorphous, and p-doped multi-crystalline as well as other silicon surfaces.

In one set of experiments, the catalytic solution was a dilute (e.g., less than about 2 mM or, in some cases, less than about 1 mM) solution of gold, silver, platinum, and other ions that may be presented in the form of $HAuCl_4$, $AgF$, and the like. This catalytic solution is added to the oxidant-etchant solution and these solutions combine under agitation to form an etch solution that etches a silicon surface. The etch time was significantly reduced relative to prior etching techniques such as less than about 4 minutes (e.g., 2 to 4 minutes or a similar time frame) to obtain a minimum achievable reflectivity (e.g., less than about 3% such as 1 to 2% or even as low as 0.2 to 0.4% in some cases such as those using gold as the catalyst) and also to achieve a relatively uniform surface texture. Such etching results were found to be achievable for both multi-crystalline and single crystalline silicon wafers of all orientations. Further, amorphous silicon layers approximately 1 micrometer thick required only about 90 seconds to achieve minimum achievable reflectance.

Regarding agitation/stirring during the etching process, both magnetic stifling and ultrasonication (e.g., 125 W or the like) were utilized for solution mixing during the etching reactions. Magnetic stirring generally was found to yield wafers with a flatter reflectivity profile over the 350 to 1000 nm wavelength range. However, magnetic stirring may not yield wafers or silicon surfaces with the minimum achievable reflectivity in the middle of this wavelength range and may be ineffective for initiation of certain black etch procedures depending upon the catalytic nanomaterial utilized. Ultrasonication or ultrasonic agitation, hence, may be more useful in some applications. Generally, in the experiments/tests run by the applicants, polytetrafluoroethylene (PTFE) or Teflon® labware was used for the investigations, and the chemicals/solutions used were clean room/reagent grade.

The oxidant-etchant solution generally includes an etching agent chosen for silicon and a silicon oxidizing agent whose decomposition can be catalyzed by the chosen catalytic metal. In one embodiment, HF is used as the etching agent while $H_2O_2$ is the oxidizing agent with the balance of the etching solution volume being deionized water. The specific make up of the oxidant-etchant solution may vary widely to practice the described etching such as 5 to 15% w/w HF, 15 to 30% $H_2O_2$ with the balance being DI $H_2O$. In one case, an oxidant-etchant solution (sometimes referred herein to as a 2× strength oxidant-etchant solution) was formed with 6.25% w/w HF, 18.75% w/w $H_2O_2$, and balance DI $H_2O$ while in another case an oxidant-etchant solution with 26.25% $H_2O_2$ and 6.25% HF was used and found effective when the wafers are deeply doped (e.g., n-doping may require longer etch times such as up to 8 minutes or more and/or higher etching solution temperatures such as up to about 45° C. or more). The final etching solution is somewhat more diluted due to the combination with the solution provided with the catalytic nanomaterial. For example, the etching solution may include equal volumes of the oxidant-etchant solution and the catalytic nanomaterial solution (e.g., a metal colloid solution), and in the above specific example, this would yield an etching solution of 3.125% w/w HF, 9.375% w/w $H_2O_2$ and DI $H_2O$ to provide a volume ratio of 1:5:2 of $HF:H_2O_2:DI\ H_2O$.

A wide variety of silicon wafers may be etched as described herein with some testing being performed on 1 square inch Czochralski wafers that were polished on one side. The wafers may be n-type or p-type with a wide range of doping (e.g., 0.25 ohm-cm to about 50 ohm-cm or the like). In particular embodiments, the resistivities of p-doped CZ, FZ, and multi-crystalline wafers (excluding tested undoped-pCZ<1,0,0> wafers) were between about 1 and about 3 ohm-cm. Also, p-doped CZ<3,1,1> wafers were tested that had a resistivity of about 0.5 ohm-cm. Further, tests were performed using p-doped CZ<1,1,1> wafers with a resistivity in the range of about 0.2 to about 0.25 ohm-cm. In the following tests, the volume of the etching solution used was typically about 5 ml to about 15 ml per square inch of silicon wafer or silicon surface with 10 ml reactant per square inch of wafer being used in some cases, but, of course, the volume may be optimized or selected to suit the size/shape of the reactant vessel and size and number of the silicon wafers processed in each batch and based on other variables.

The stripping solution used to remove remaining nanoparticles after etch is complete may also vary to practice the process and is typically selected based on a number of factors such as to provide a chemistry suitable for the catalytic nanomaterial. When the nanoparticles were silver or gold, the stripping solution may be 25 g $I_2$/100 g KI per liter of DI $H_2O$ or aqua regia or the like, and the stripping or metal removal time, agitation technique, and volume of stripping solution may be similar or even the same as used in the etching process. Reflectance measurements after etching and stripping may be performed in a number of ways such as with a Cary- 5G UV-vis spectrometer that is equipped with a calibrated spherical reflectance or similar device. Real-time UV-visible reflectance spectrometry assays may be performed to obtain information about the progress of etching using devices such as an Ocean Optics' fiber-optic pixel may UV-visible spectrometer.

With respect to time, the stability of the pre-mixed etching solution formed with $HAuCl_4$ solution may be relatively short such as about 2 minutes at room temperature, and after this time, gold nanoparticles may form such as by the in-situ reduction of $Au^{3+}$ by $H_2O_2$, rendering the pre-mixed etching solution inactive or less active with respect to achieving black etching. Hence, it may be desirable to combine the catalytic solution with the oxidant-etchant solution in the vessel in the presence of the silicon surfaces to be etched or forming the etching solution and then promptly placing this solution in the vessel containing the silicon wafer(s). One useful procedure entails placing the Si wafer in the $HAuCl_4$ solution prior to the addition of the 2× strength oxidant-etchant solution and then performing concurrent or subsequent ultrasonication such as for about 3 to 4 minutes or longer. In one implementation/experiment, the size of the resultant "Purple of Cassius" gold particles from catalytic solutions of 0.4 mM $HAuCl_4$:2× strength black etch after 4-minute etching was determined by TEM to be less than about 10 nm. XPS spectroscopy revealed that the gold particles did not contain Au(I) ions, (e.g., from AuF) but only or mainly $Au^0$.

One useful catalytic concentration of $HAuCl_4$ has been determined via iterative experiments to be about 0.0775 mM for p-CZ<1,0,0≥ wafers while about 0.155 mM was useful for p-doped CZ<1,1,1> and <3,1,1> wafers and about 0.31 mM was found desirable for p-multi-crystalline wafers. In some experiments, p-FZ wafers and un-doped p-CZ<1,1,1>, {*R 75 Ω-cm} silicon surface were better etched with a catalytic solution containing a minimum $HAuCl_4$ of about 0.04 mM. Hence, wafers containing excess positive carriers and, in some cases, having a lower sheet resistance may be better or completely black etched or textured with a higher $HAuCl_4$ concentration or amount provided in the etching solution.

Further, electrochemical experiments involving the placement of Au-plated alligator clips on the dry portions of test p-FZ wafers placed in a 10 nM black-etch reaction limiting concentration and a Pt-wire counter electrode revealed that a positively-charged Si surface enhances the black etch procedure while a negatively charged Si surface hinders it. This appears to support the concept that the etching processes described herein involve a mechanism involving a Silyl ($Si_3^+$) transition-state at the crystal surface, which may be formed by the initial HF etch of thin (e.g., 7 to 20 Angstrom) $SiO_2$ films by the 2× strength oxidant-etchant solution in the presence of the catalytic solution.

The possibility of increasing the etching rate of the silicon surface by increasing temperature has been confirmed by the observation of a 4-fold rate increase with a 20° C. increase in reaction temperature when the etching process including heating of the etching solution. For example, in some implementations, etching was performed for about 30 to 60 seconds and texturing reached about the same degree of black-etch at 45° C. etching temperature compared with about 180 to 240 seconds or more provided for etching time with etching solutions maintained at room temperature (e.g., about 25° C.).

With the use of a catalytic solution including $HAuCl_4$, perpendicular and cross-sectional SEM studies of mono-crystalline <1,0,0> Si wafers tested have revealed a uniform surface morphology containing an average 20 to 25 nm diameter cylindrical etch tunnels (as shown in FIG. 2) approximately 275 nm deep for the "standard" 3 to 4 minute etching process. Perpendicular and cross-sectional SEM studies of mono-crystalline <1,1,1> Si wafers tested have revealed a uniform surface morphology containing few, if any, of the 20 to 25 nm diameter cylindrical etch tunnels obtained above, but instead, included a plurality of 35 to 50 μm diameter circular plates. These raised plates or islands were separated from each other and offset vertically from each other by about 0.6 to about 1.2 μm. However, to the eye, and based on testing with UV-vis reflectance spectroscopy, there is little or no difference in the "darkness" between the <1,0,0> and <1,1,1> black etched wafers.

Observations made for a p-CZ<1,1,1> Si sample used for the SEM results referred to in the above paragraph, which had been subject to the Gold removal (as $AuI_3$) with $I_2$/KI solution as compared to the Gold-containing sample, show that a smoothing of the pancake-like features can be observed with the concomitant elimination of a few tunnel-like features. Initial indications from both stylus and optical profilometry on some p-CZ<1,1,1> Si samples that had been subjected to the $I_2$/KI solution and had 12.4 nm of aluminum evaporated onto it, showed only flat surface morphology. Testing results generally indicate the etching processes described herein are effective in texturing a wide variety of silicon surfaces, and such texturing of a variety of surfaces likely will be advantageous in solar cell design and functionality.

In one specific experiment, a 4-minute etch was performed on a <1,0,0> p-CZ silicon wafer. The catalytic solution in this experiment was about 0.31 mM $HAuCl_4$ at a 50:50 volume ratio in the etch solution with 2× strength oxidant-etchant solution (e.g., HF and $H_2O_2$). Real-time reflectivity measurements indicate that across a wide spectrum or wavelength range of 575 nm to 1160 nm that reflectance rapidly (e.g., less than about 50 seconds) dropped to less than 10% and by about 180 seconds had reached a minimum reflectance near zero (e.g., in the range of 0.2 to 1%).

Figure 5:
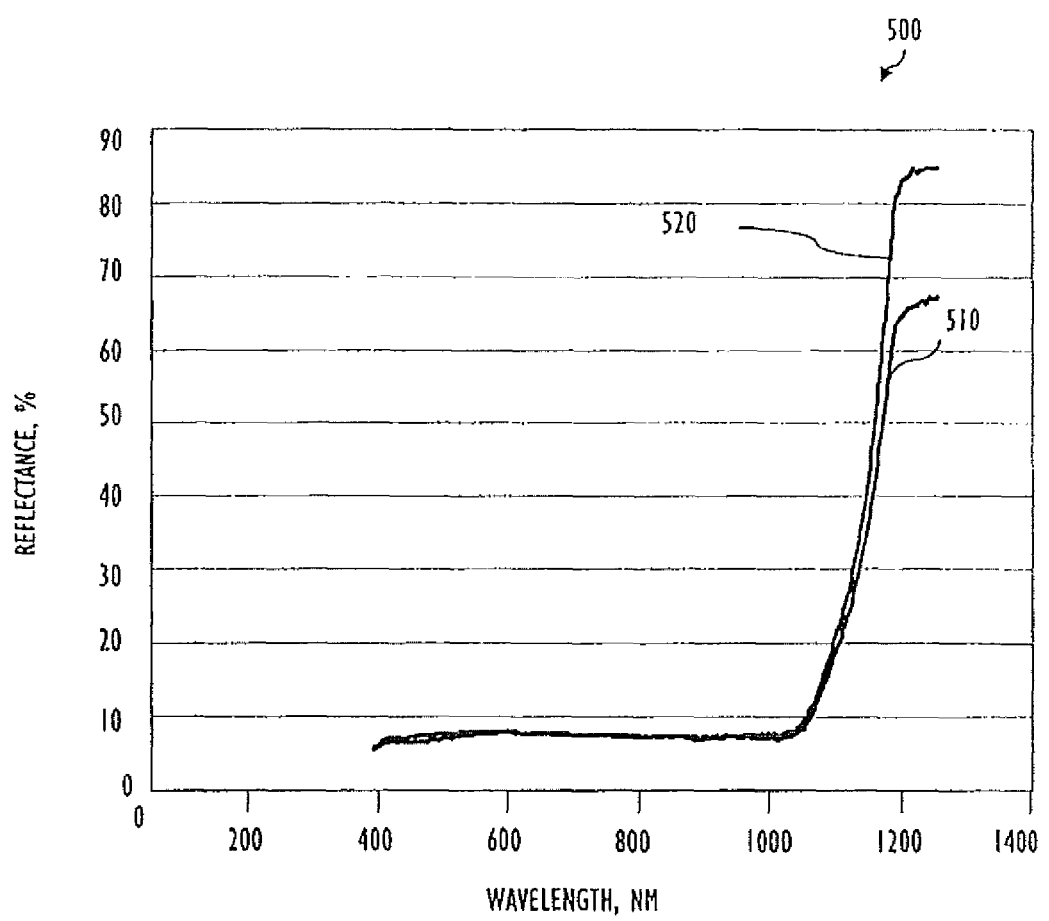
FIGS. 5-7 are graphs illustrating reduced reflectance levels achieved in experiments or tests performed on silicon surfaces using etching solutions produced from a volume of catalytic solution and a volume of oxidant-etchant solution.

In another experiment, an etch solution of about 5.0 ml/0.5 $in^2$ was used to etch a p-CZ <1,0,0> silicon wafer with sonication for about 4 minutes. In this case, the catalytic solution was 0.29 mM AgF to provide silver as the catalytic metal during etching. The etching solution also included an equal volume of 2× oxidant-etchant solution with HF and $H_2O_2$. FIG. 5 illustrates a graph 500 illustrating the results with line 510, while line 520 shows similar results after etching and removal of the remaining silver. In FIG. 5, the increase in reflectivity for wavelengths above about 1100 nm is caused by a reflective background behind the silicon wafer during measurement. Kinetics of this sample wafer showed that after about 30 seconds reflectance was reduced to below 10% over wavelengths from about 575 nm to 1160 nm while minimum achievable reflectance in the range of about 0.1 to 1.5 was achieved in the range of about 130 to 240 seconds. When the catalytic solution was changed to 0.31 mM $HAuCl_4$, the resulting reflectance was generally less than about 5% from 350 nm to 1000 nm with the typical value being less than about 1%.

Excellent results were also achieved in etching p-mc silicon with a catalytic solution of 0.31 mM $HAuCl_4$ combined with 2× strength of oxidant-etchant solution. Again, the etching solution was agitated for about 4 minutes and the gold was then removed. The etched or textured layer on the silicon surface showed reflectance of less than about 10 percent from 350 to 1000 nm wavelength light with an average of less than about 5 to 6%.

Figure 6:
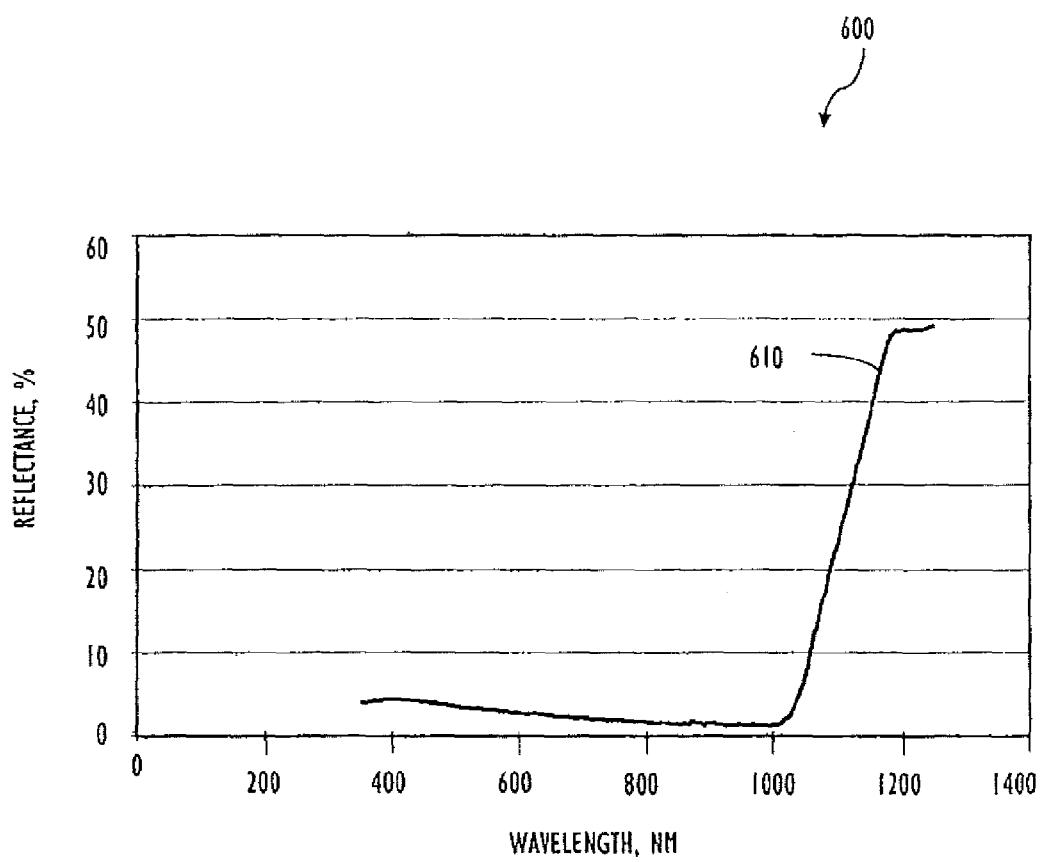

FIG. 6 illustrates a graph 600 with the results of etching of a single crystal silicon surface shown with line 610. In FIG. 6, the increase in reflectivity for wavelengths above about 1100 nm is caused by a reflective background behind the silicon wafer during measurement. In this experiment, the etching solution included equal volumes of 0.39 mM $HAuCl_4$ and of oxidant-etchant solution with 6.25% HF and 26.25% $H_2O_2$ and etching proceeded for 4 minutes in this strong solution, followed by an aggressive surface oxide strip with 5% HF under sonication for 5 minutes. This strong black etching solution was often beneficial in texturing surfaces that were free of oxide. The results show, that reflectance of the surface was lowered to less than about 5% and down to about 1 or 2% in some portions of the 350 to 1000 nm spectrum.

Etching has also been completed on other silicon surfaces with catalytic solutions such as 0.31 mM $HAuCl_4$ or the like. For example, a black etch was performed for 3.5 minutes on a 0.67 micrometer n-doped amorphous silicon layer on a stainless steel substrate using the 0.31 mM $HAuCl_4$ catalytic solution combined equally with 1× strength oxidant-etchant solution of HF and $H_2O_2$. In this case, the reflectance was generally 5 to 10% less over the 350 to 1000 nm wavelength range, but reflectance still averaged about 40%. Better results were seen when a black etch was performed on a 1.0 micrometer non-doped amorphous silicon layer on a stainless steel substrate. In this test, etching was performed for 90 seconds with a 1:1 volumetric ratio of 0.31 mM $HAuCl_4$ and 2× strength oxidant-etchant solution. The reflectance was reduced about 15 to 25% across the 350 to 1000 nm spectrum to values ranging from about 18 to about 60%. Reasonable results were also achieved when a 2.45-minute black etch was performed on 1.0 micrometer non-doped amorphous silicon on a glass substrate with an etch solution having equal volumes of 0.31 mM $HAuCl_4$ and 2× strength oxidant-etchant solution. Testing of such an etched surface showed a significant reduction of reflectance at the lower end and at the higher end of the 350 to 1200 nm spectrum, with less change from about 700 nm to about 800 nm, e.g., with reflectances ranging from about 15% to about 43%. Black etching as taught herein was also performed on a 1.0 micrometer p-doped amorphous silicon layer on a stainless steel substrate with similar etching solution as in the prior example. This texturing provided a reflectance reduction to about 25% to about 50% in the 350 to 1000 nm spectrum. Excellent results were obtained in an experiment where an anisotropically KOH/IPR etched p-FZ silicon wafer was black etched for 4 minutes with a 1:1 volumetric ratio etching solution of 0.39 mM $HAuCl_4$ and 2× strength oxidant-etchant solution followed by 5 minutes of gold removal from the etched surface. The tests show this surface generally has a reflectance in the range of about 1 to 3% or lower across the 350 to 1000 nm spectrum.

Figure 7:
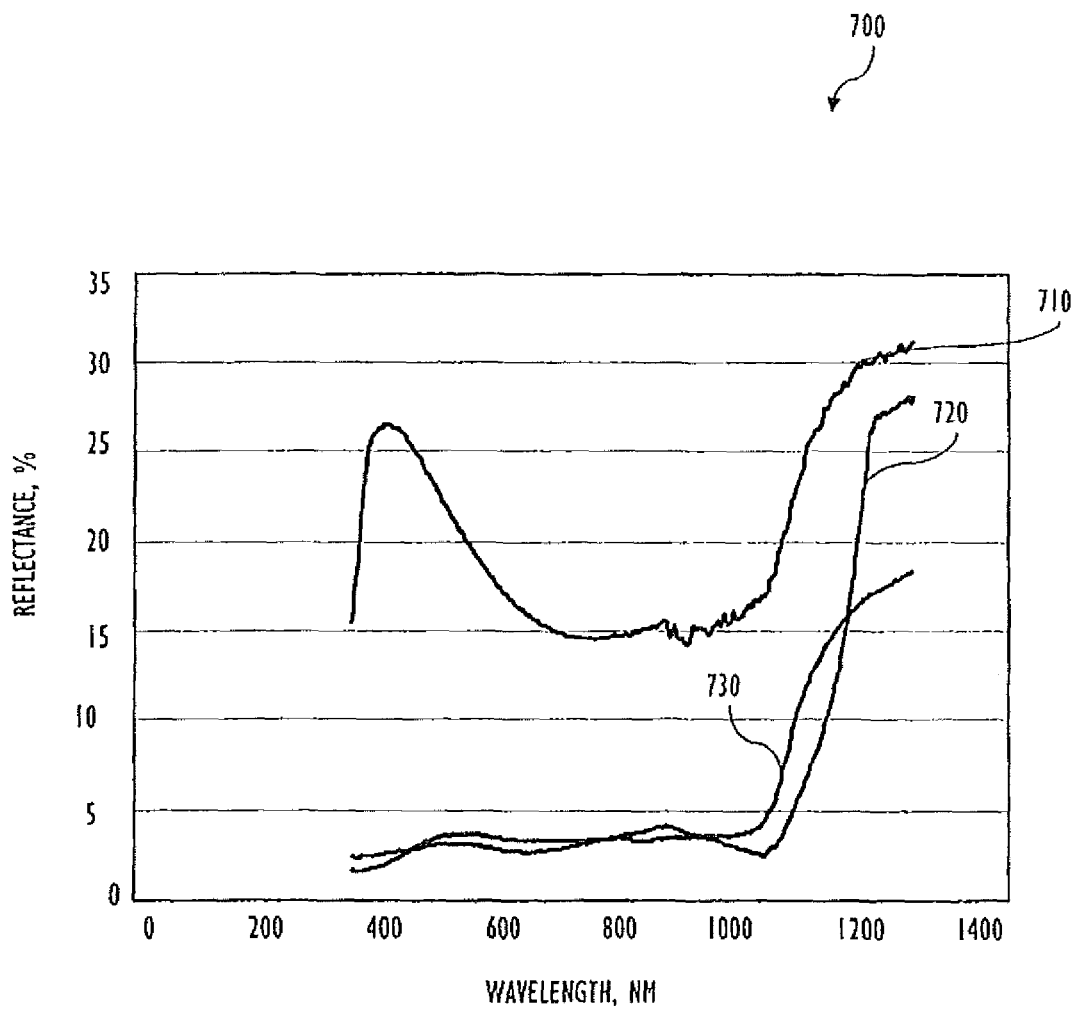

FIG. 7 illustrates a graph 700 providing results of an exemplary 8-minute black etch performed on a heavily n-diffused (e.g., $POCl_3$ @ 950° C. for 1 hour) p-FZ<100> silicon wafer. In this etching process, the etching solution included equal volumes of 0.4 mM $HAuCl_4$ and oxidant-etchant solution (with 26.25% $H_2O_2$). As shown with line 710, when the etching was performed without adding light or illuminating the silicon surface and etching solution with high intensity light reflectance was only lowered to about 15% to about 27% in the useful 350 to 1000 nm spectrum. In contrast, when the etching method further included providing light sources at about 50 mm above the wafer, the etching results were much more desirable for using the silicon surface in a solar cell or similar application in which low reflectance is desired. As shown with line 720, when the etching is carried out in the presence of a 6V flashlight/light source that is operated to direct light onto the wafer surface through the etch solution, the reflectance in the 350 to 1000 nm range is lowered to below about 5% (e.g., in the 2.5 to 4% range). Similarly, when the light source is a 3 W, 12 V LED the reflectance as shown with line 730 is reduced below 5% to the range of about 2 to about 4% over the 350 to 1000 nm wavelength range. Hence, in some implementations, light sources may be used to provide light (e.g., relatively high-intensity and/or directed light with a significant component of blue light that is considered to be useful) that can be directed onto the etched surface to act as a further driver of the etching process, and anti-reflection surfaces are better obtained by adding illumination when etching a silicon surface such as that found in a solar cell with a diffuse junction of n-emitter on a p-base wafer.

While a number of exemplary aspects and embodiments have been discussed above, those of skill in the art will recognize certain modifications, permutations, additions, and sub-combinations thereof. It is therefore intended that the following appended claims and claims hereafter introduced are interpreted to include modifications, permutations, additions, and sub-combinations to the exemplary aspects and embodiments discussed above as are within their true spirit and scope. As will be understood from the above description, the catalytic etching of silicon based on catalytic molecular or ionic species is useful for eliminating previously used deposition process for creating metal clusters or islands. Expensive metallic nanoparticles are not employed though such nanoparticles may be created during the etching process and contribute to the catalytic process producing the surface texture. Further, the described etching process provides excellent control over silicon characteristics such as reduction of reflectance to facilitate use of textured silicon in solar cells with numerous tunnels being bored or formed fairly uniformly across the silicon surface (e.g., a single nanoparticle may act to catalyze a hole of about the diameter being created in the surface and then etching a very high aspect ratio tunnel or pit in the surface such as a hole diameter of 2 to 30 nm and a tunnel depth in the 200 to 300 nm range).

In some implementations, it may be desirable to modify the system 100 and/or method 300 to utilize a metal chemistry based on use of copper nanoparticles to etch a silicon substrate. Through the use of Cu-assisted etching, a solar cell such as cell 400 shown in FIG. 4 may be produced with a silicon substrate, e.g., substrate 410, with an AR coating or nanoporous or textured surface with reflectance of less than about 5 percent as tests have shown a $R_{ave}$ of about 3 percent using the Cu-assisted etching processes described herein.

For example, the system 100 may be modified such that the Si wafer, substrate, or device 110 that is provided into the wet etching vessel is first coated with copper nanoparticles (which eliminates the need for catalytic solution 140). Further, the chemistry of the black etch solution 146 may be modified as discussed below. Additionally, the temperature (measured by sensor 130) may be controlled (such as by operation of heater 128) to obtain a desirably low $R_{ave}$, and the use of copper alters the metal stripping solution 150 and/or post-etching steps (e.g., use concentrated $HNO_3$ in some cases). The following discussion elaborates on exemplary process steps for performing Cu-assisted etching of a silicon substrate to make it anti-reflective (e.g., black silicon), with the understanding that this teaching may build and expand upon the above teachings (but without ongoing or additional references to the system 100 of FIG. 1 and method 300 of FIG. 3).

Initially, as discussed above, Cu nanoparticles may be deposited upon a silicon surface (e.g., a Si substrate, wafer, or device) to prepare it for a later wet etching step. In some embodiments, the Si wafer or substrate undergoes electroless copper deposition (e.g., 1 minute Cu electroless deposition). It is believed that it may be useful in obtaining a low reflectivity porous Si surface to maintain a ratio of particle size to spacing on the Si surface of about 3 to 5. In some implementations, a particle size to spacing ratio of approximately 4. The size of the Cu particles may be chosen to be 16 to 28 nm and then the spacing may be 4 to 7 nm between particles on the Si surface. In one particular case, 20 nm Cu particles were deposited on the Si surface (or black silicon samples) and spacing averaged about 5 nm.

At this point in the description, it may be useful to describe a systematic study that was performed to determine useful Cu-assisted etching processes to produce a desirable AR coating or surface on a Si substrate. The study was conducted on black silicon that has undergone an electroless deposition of Cu nanoparticles (as discussed above). Each Cu nanoparticle-coated Si sample was etched in a wet etching vessel in an etching solution heated to about 50° C. with agitation/mixing for about 5 minutes. The study was conducted to determine the effect or result of varying HF volume concentration in the etching solution and also varying Rho ($\rho$), which equals the molar concentration of HF divided by the sum of molar concentrations of HF and $H_2O_2$ (i.e., $\rho=[HF]/([HF]+[H_2O_2])$), of the etching solution.

TABLE 1

| Sample | $\rho$ | HF Vol (ml) | $H_2O_2$ vol (ml) | $H_2O$ vol (ml) |
|---|---|---|---|---|
| BSi11F-1 | 22 | 0.25 | 1.5 | 50 |
| BSi11F-2 | 36 | 0.5 | 1.5 | 50 |
| BSi11F-3 | 59 | 1.25 | 1.5 | 50 |
| BSi11F-4 | 69 | 2 | 1.5 | 50 |
| BSi10F-4b | 74 | 2.5 | 1.5 | 50 |
| BSi11F-5 | 80 | 3.5 | 1.5 | 50 |
| BSi11F-6 | 90 | 8 | 1.5 | 50 |

Table 1 shows results of this study with regard to varying HF volume while holding $H_2O_2$ and $H_2O$ volumes constant in the etching solution. It can be seen that $\rho$ varies with the changing HF volume. The changes in $\rho$ leads to changes in the achieved etching of the Si surface and corresponding reflectivity (as can be seen further with reference to FIGS. 8-11).

Figure 8:
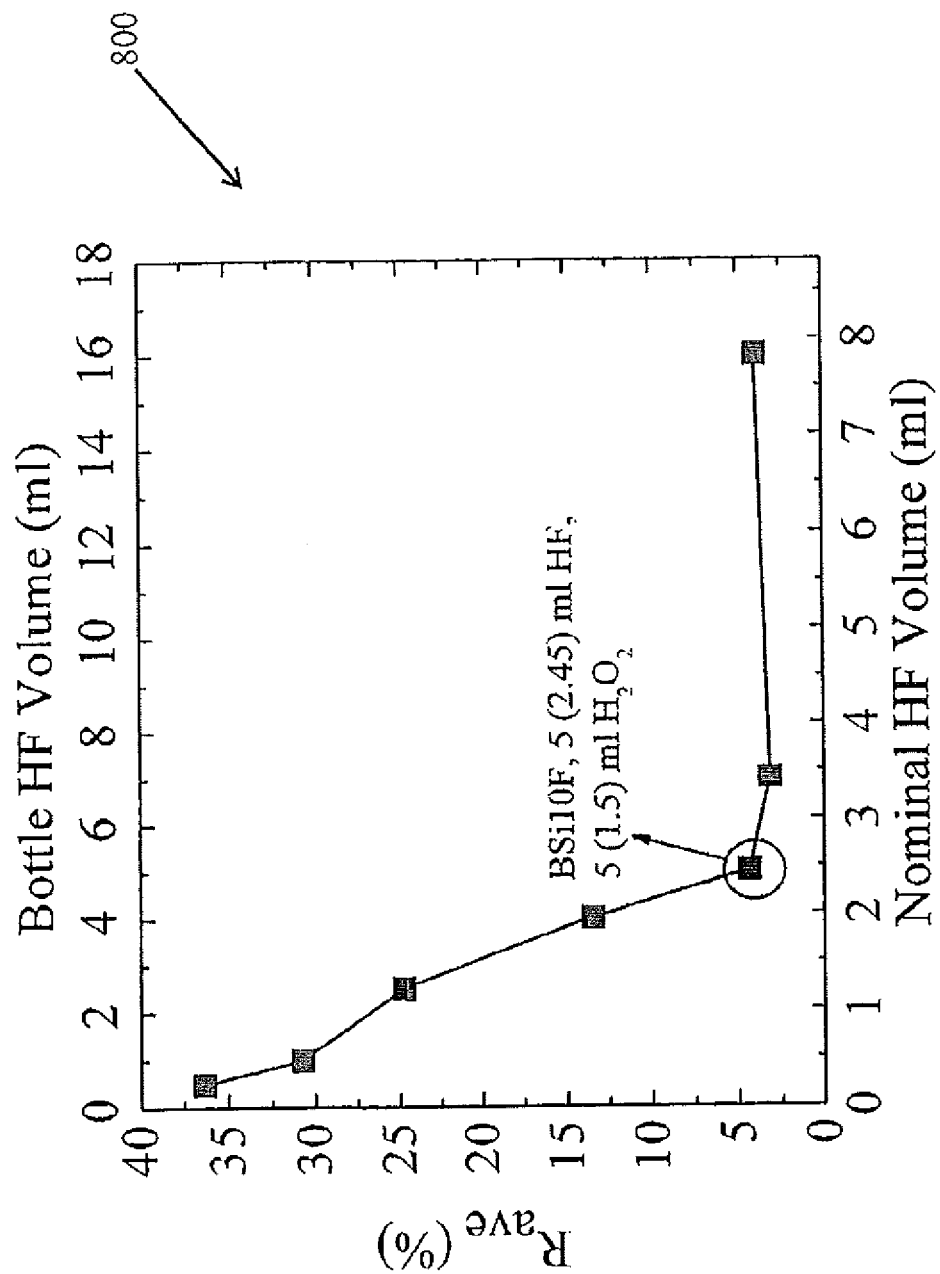
FIG. 8 is a graph illustrating changes in reflection with increasing HF for a Si-surface etched after deposition of Cu nanoparticles.

Particularly, FIG. 8 illustrates a graph 800 showing the solar spectrum-weighted average reflection, $R_{ave}$, compared with HF volume for these seven etched Si samples with Cu-assisted AR surfaces. As shown, increasing HF volume, with constant volumes of $H_2O_2$ (e.g., 5 ml) and $H_2O$ (e.g., 50 ml) results in a decreasing $R_{ave}$ from over 35 percent down to below 5 percent (e.g., $R_{ave}$ of about 3%).

Figure 9:
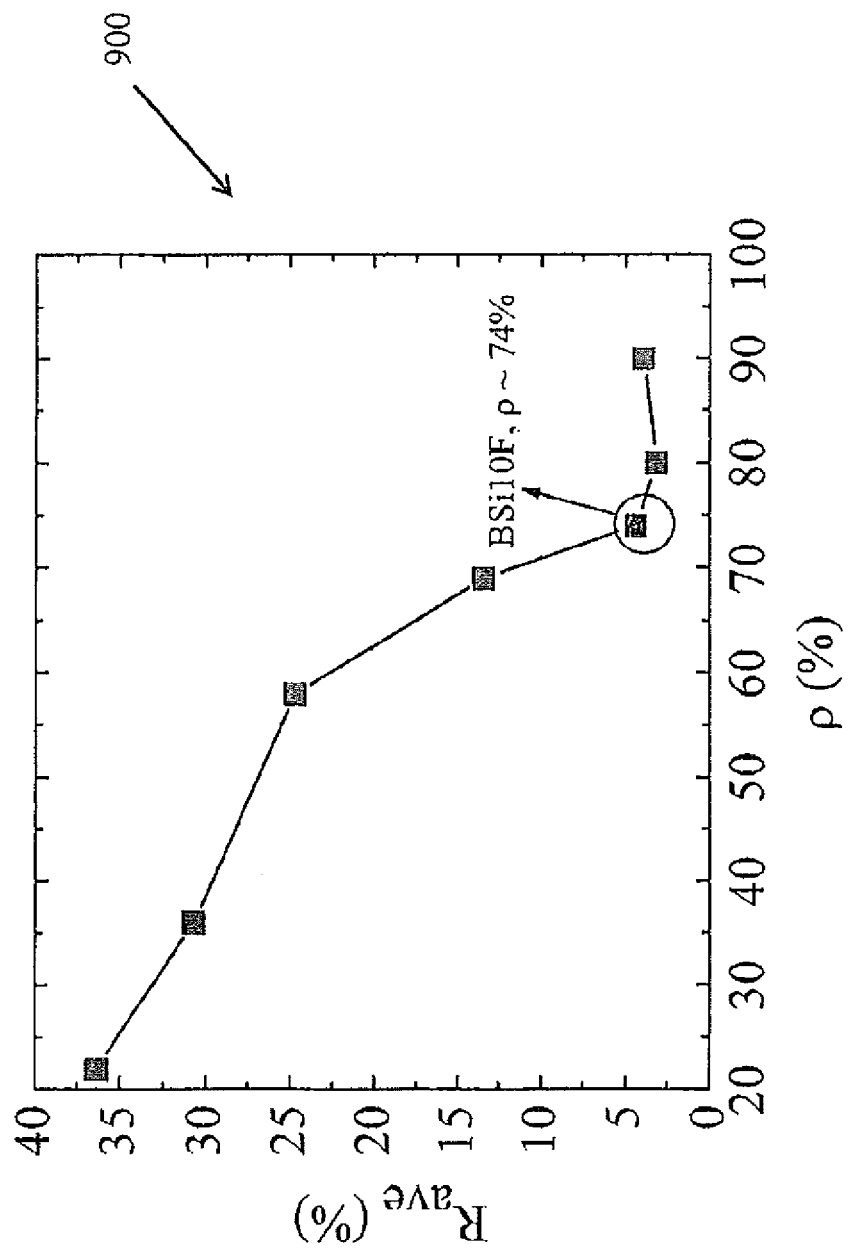
FIG. 9 is a graph showing reflection values over a range of $\rho$ values for an etching solution used in a Cu-assisted etching process described herein.

FIG. 9 illustrates a graph 900 showing for the seven samples of this study the relationship of $R_{ave}$ to $\rho$ being that an increasing $\rho$ provides a decreasing $R_{ave}$. The graph 900 indicates that if a goal $R_{ave}$ for a silicon device (such as for a solar cell) is less than about 5 percent it may be desirable to use an etching solution with a $\rho$ value of at least about 70 percent (such as at least about 74 percent to achieve $R_{ave}$ of about 3 percent). SEMS analysis and inspection of these samples shows an increasing density of etched holes/tunnels and increased roughness/depth of tunnels with increasing $\rho$ values, which supports and/or explains in part the low values of $R_{ave}$ obtained with higher $\rho$ values.

Figure 10:
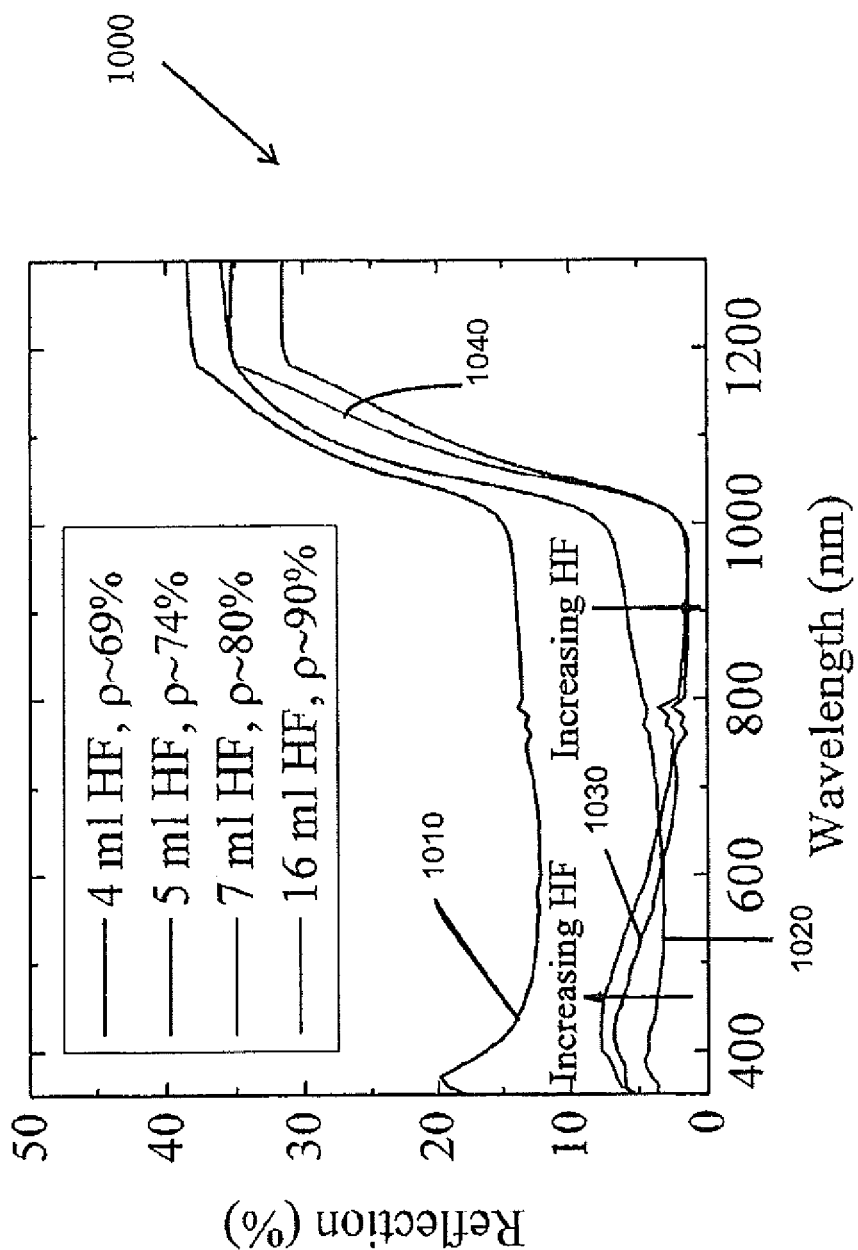
FIG. 10 is a graph illustrating reflection versus wavelength for four Si samples etched with etching solutions with four different (and relatively high) $\rho$ values.
Figure 11:
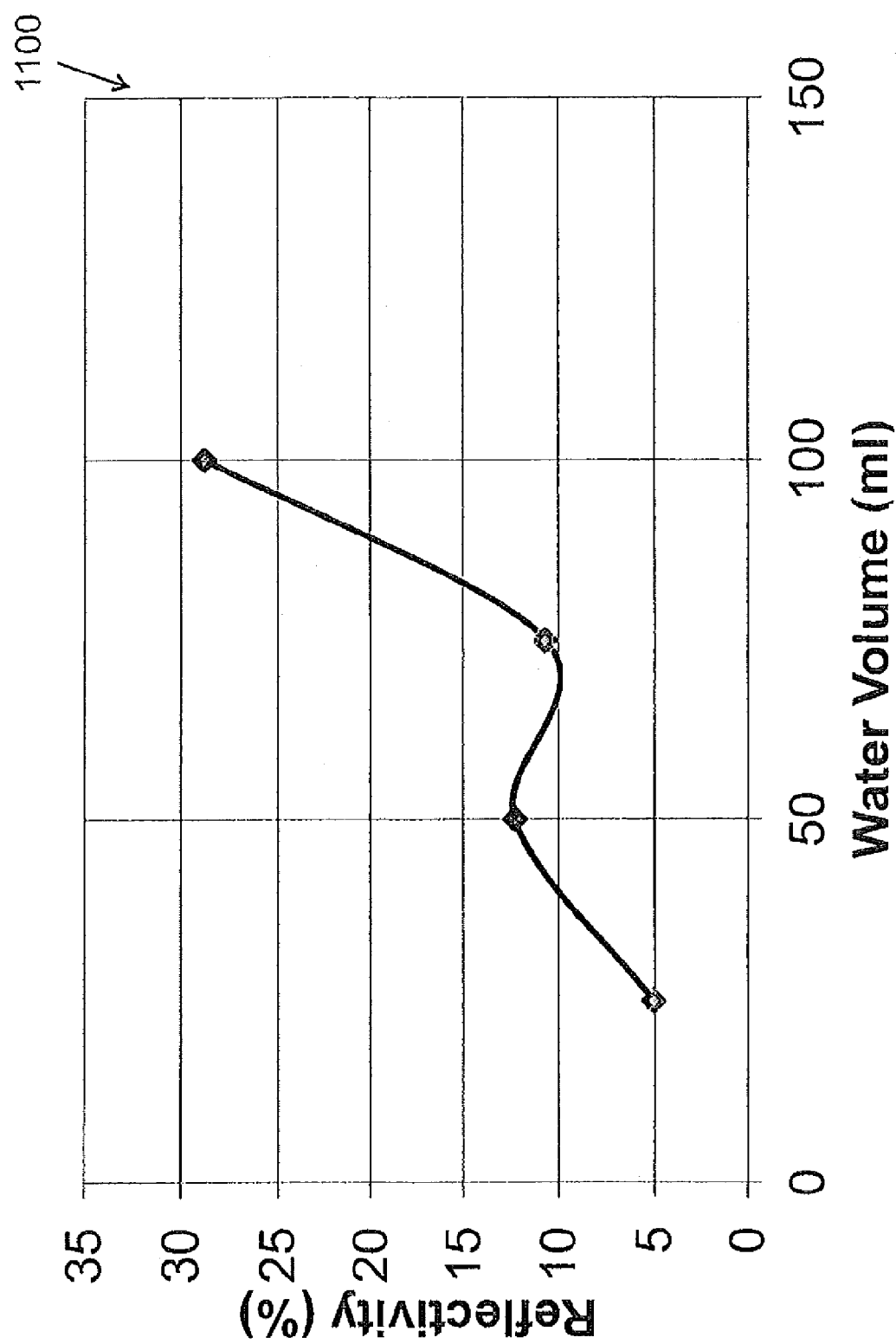
FIG. 11 is a graph illustrating the effect of increased water in an etching solution and, correspondingly, of decreased concentrations of an etching agent and an oxidizing agent.

FIG. 10 illustrates a graph 1000 illustrating the four samples with the lowest reflection versus wavelength. In graph 1000, line 1010 provides data for a Si surface etched with an etching solution with a $\rho$ value of 69 percent, line 1020 provides data for a Si surface etched with an etching solution with a $\rho$ value of 74 percent, line 1030 provides data for a Si surface etched with an etching solution with a $\rho$ value of 80 percent, and line 1040 provides data for a Si surface etched with an etching solution with a $\rho$ value of 90 percent.

The graph 1000 is useful for showing that the etched Si surfaces provided by Cu-assisted etching with a $\rho$ value of at least about 74 percent are useful in providing low reflection, e.g., less than 3 percent, for many wavelengths (ranges of most interest in many solar cell applications). This means the HF concentration should be maintained at least 3 times that of the $H_2O_2$ concentration in the solution.

An additional test was performed in which $\rho$ was maintained at about 80 percent (i.e., 7 ml HF and 5 ml $H_2O_2$), but the volume of $H_2O$ in the etching solution was increased. The results of 10 minute etch with four differing $H_2O$ volumes relative to reflectivity is shown in the graph 1100 of FIG. 11. As can be seen, reducing the concentration of the etching and oxidizing agents (HF and $H_2O_2$) causes the reflectivity to increase well above 5 percent, which often is undesirable. In other words, it may be desirable to achieve less than 5 percent reflectivity to maintain the concentration of HF at about 10 percent (or higher) and concentration of $H_2O_2$ at about 10 percent (or higher).

Based on the above results, it is clear that Cu-assisted etching can be used to produce Si wafers (or other elements) with low reflectivity surfaces. An additional study was performed to prepare solar cells on a set of eight silicon samples. To prepare the samples for wet etching with an etching solution of HF, $H_2O_2$, and $H_2O$, each of the eight samples was coated with copper using a 1-minute electroless Cu deposition. The black etching solution recipe in this study was 50 ml $H_2O$, 5 ml HF, and 5 ml $H_2O_2$ (so HF concentration of about 8 percent (i.e., more dilute than the above example) and an $H_2O_2$ concentration of about 8 percent (again more dilute than the above study indicating that at least about 8 percent concentrations may be adequate)).

During the etching, solution mixing and/or agitation was used to obtain a desired result (see agitation, such as sonication, as discussed above with regard to performance of etching steps). Further, the study was used to show that heating (particular temperature ranges) was useful during etching to obtain low $R_{ave}$. In this study, post-etching was used to remove the copper, and the Cu removal was performed using concentrated $HNO_3$ at RT for 3 minutes with sonication (mixing/agitation).

TABLE 2

| Etch Conditions | $R_{ave}$ (%) | $J_{sc}$ (mA/cm$^2$) | FF (%) | $\eta$ (%) | $V_{oc}$ (mV) |
|---|---|---|---|---|---|
| Planar Reference | 32.1 | 27.2 | 79.6 | 13.4 | 621 |
| Pyramid Reference | 9.4 | 35.8 | 76.9 | 17.2 | 625 |
| Pyramids with 5 min black etch at 30° C. | 3 | 36.6 | 75.4 | 17.0 | 616 |
| Pyramids with 5 min black etch at 50° C. | 3.5 | 34.5 | 77.2 | 16.3 | 610 |
| Planar with 5 min black etch at 30° C. | 14.1 | 31.6 | 79.3 | 15.6 | 623 |
| Planar with 5 min black etch at 50° C. | 5.2 | 34.0 | 74.4 | 15.5 | 615 |
| Pyramids with 10 min black etch at 30° C. | 3.5 | 28.9 | 78.1 | 13.6 | 604 |
| Planar with 10 min black etch at 30° C. | 5.3 | 32.8 | 79.2 | 15.9 | 610 |

Table 2 illustrates the photovoltaic illuminated current-voltage properties of the eight Si samples after completion of Cu-assisted etching and post-etching processing to remove the Cu and formation of diffused junction solar cells. As can be seen, both planar and pyramid Si surfaces were tested and processed at differing metal-assisted etching temperatures (30 and 50° C.) and differing times (5 and 10 minutes) to test these four different metal-assisted etching temperatures.

Again, if the goal of the etching process is to provide low reflectance (e.g., about 5 percent or lower or about 3 percent values for $R_{ave}$) the temperature and time may both have to be controlled and may have to be set based on the type of Si surface being etched (planar versus pyramid). For example, a $R_{ave}$ value of 3% was achieved with a pyramid Si sample with this etching solution/recipe with a 5 minute etch at 30° C., but the value of $R_{ave}$ actually increased with increased temperature of the etching solution. With this etching solution recipe, a planar Si sample was provided a lower $R_{ave}$ by using a longer etching period at lower temperatures or a shorter etching at higher temperatures. From Table 2, it can be seen that solar cell efficiency up to 17.0% and open-circuit voltage up to 623 mV were obtained on solar cells with anti-reflection provided by Cu-assisted etching.

As discussed above, the method 300 (and system 100) may be modified to implement the Cu-assisted etching particularly to replace the addition of a catalytic solution with electroless or other deposition of Cu nanoparticles upon a silicon surface. The modifications also may involve use of differing recipes for the etching solution, control of etching with regard to time and temperatures, and post-etching to remove the copper prior to formation of a solar cell or other device with the etched Si element. It will be recognized by those skilled in the art that while the above recipes for the etching solution discussed use of HF, $H_2O_2$, and $H_2O$ that Cu-assisted etching, in some cases, can be performed with differing etching and/or oxidizing agents (e.g., some or all of the agents listed with regard to the silver and gold etching processes).

In one implementation of a Cu-assisted etch of a silicon surface, the following processing steps were used with a silicon substrate (after Cu deposition had been performed) to form a solar cell: (1) 25 minute KOH etch with $N_2$ bubbler; (2) 10 minute acid RCA clean; (3) 5 minute, 30° C., Cu black etch with agitation; (4) 2 minute, 10% HF dip, acid RCA, 1 minute 10% HF dip, and base RCA; (5) 1-step $POCl_3$, with 5 minute $POCl_3$/oxidation with 30 minute $O_2$ (505 Angstrom thick PSG+oxide, $\rho$=73Ω/□); (5) back side oxide removal (buffered HF, 30 seconds); (6) back side reactive ion etch (RIE, 10 minutes, $SF_6$ 5 sccm, 30 W); (7) Al alloying (e.g., double boat holder); (8) SPR 220 photolithography for metal grid pattern (exposure time 80 seconds); (9) front surface oxide removal (buffered HF, 45 seconds); (10) metallization: thin metal contact (Ti/Pd/Ag/Pd 500/600/12500/1000 Angstroms); (11) lift-off; (12) isolation pad lithography; (13) buffered HF for 45 seconds to remove oxide before RIE etch; (14) front side reactive ion etch (7 minutes, $SF_6$ 5 sccm, 30 W); (15) resist strip; and (16) testing of solar cell. This solar cell has its antireflection provided entirely by the Cu-assisted etching of the Si surface to provide a tapered density and has no additional anti-reflection coating layer applied to it.

Testing of a solar cell fabricated with these steps (including Cu-assisted etching of the Si surface) showed the cell had efficiency of about 17 percent and reflection of less than about 5 percent (e.g., near 3 percent) for much of the light spectrum (e.g., wavelengths of about 350 to 1000 nm). This and the other tests/studies of samples demonstrate that low solar spectrum weighted reflection and high efficiency, which are desirable for solar cells, is achievable using copper as the nanoporous etch catalyst. The Cu-based catalyst can readily be provided through electroless deposition of Cu nanoparticles on a surface of a silicon substrate (e.g., 16 to 24 nm Cu particles with average spacing of 4 to 6 nm or the like). No anti-reflection coating to provide low reflectivity is needed if the Cu-assisted metal etching is used as described herein.

The invention claimed is:

1. A method of texturing a silicon surface to reduce reflectivity, comprising:
    positioning a substrate with a silicon surface in a vessel, wherein the silicon surface comprises a plurality of copper particles;
    filling the vessel with a volume of an etching solution that covers the silicon surface of the substrate, wherein the etching solution comprises an oxidant-etchant solution that comprises an etching agent and a silicon oxidizing agent; and
    etching the silicon surface by agitating the etching solution in the vessel, whereby the reflectivity of the silicon surface is reduced to less than about 10 percent.

2. The method of claim 1, wherein the etching is performed until the etched silicon surface has a reflectivity of less than about 5 percent in a wavelength range of about 350 to about 1000 nanometers.

3. The method of claim 1, wherein the etching agent comprises HF and the silicon oxidizing agent is an oxidizing agent selected from the group consisting of $H_2O_2$, $O_3$, $CO_2$, $K_2Cr_2O_7$, $CrO_3$, $KIO_3$, $KBrO_3$, $NaNO_3$, $HNO_3$, and $KMnO_4$.

4. The method of claim 3, wherein the silicon oxidizing agent comprises $H_2O_2$ and wherein the etching solution has a value of rho ($\rho$) of at least about 70 percent, $\rho$ being defined as a molar concentration of HF divided by a sum of the molar concentrations of HF and $H_2O_2$.

5. The method of claim 3, wherein the oxidizing agent comprises $H_2O_2$ and wherein a concentration of the etching agent is at least about 10 percent of total volume of the etching solution and wherein a concentration of the oxidizing agent is at least about 2 percent.

6. The method of claim 1, further comprising, prior to the positioning of the substrate, performing electroless deposition to deposit the copper particles on the silicon surface.

7. The method of claim 6, wherein the electroless deposition comprises providing particle-to-particle spacing on the silicon surface in the range of 3 to 8 nanometers.

8. The method of claim 1, wherein, during the etching of the silicon surface, the etching solution is heated to a temperature in the range of 30 to 50° C.

9. The method of claim 1, wherein the silicon surface comprises p-type doping or n-type doping, wherein the etching is performed for a time period of a length chosen such that the etching creates a plurality of tunnels in the silicon surface having a depth greater than about 200 nanometers, and wherein the silicon surface is single crystalline, multi-crystalline, or amorphous and further comprising the step of fabricating a solar cell including the silicon surface.

10. A method of reducing reflectivity of a silicon surface, comprising:
    depositing copper nanoparticles on the silicon surface;
    positioning the silicon surface in a volume of an etching solution;
    agitating the etching solution until the silicon surface is etched to have a texture that reduces reflectivity of the etched silicon surface to a value below 10 percent; and
    removing the copper nanoparticles from the etched silicon surface with a stripping solution.

11. The method of claim 10, wherein the etching solution comprises HF and $H_2O_2$.

12. The method of claim 11, wherein the etching solution has a value of rho ($\rho$) of at least about 74 percent, $\rho$ being defined as a molar concentration of HF divided by a sum of the molar concentrations of HF and $H_2O_2$.

13. The method of claim 11, wherein the etching solution further comprises $H_2O$ and wherein a volume percentage of the HF in the H$_2$O is greater than about 10 percent and a volume percentage of the H$_2$O$_2$ in the H$_2$O is greater than about 2 percent.

14. The method of claim 10, wherein the etching solution comprises an oxidizing agent of silicon and an etching agent comprising hydrofluoric acid and further including the step of fabricating a solar cell including the etched silicon surface.

15. The method of claim 14, further comprising, concurrent with at least a portion of the agitating, heating the etching solution to at least about 30° C., and wherein the agitating step comprises sonication.

16. The method of claim 10, further comprising, during the agitating, operating a light source to illuminate the silicon surface with a quantity of light.

17. A method of texturing a silicon wafer, comprising:
depositing catalytic metal particles comprising copper on the silicon wafer;
placing the silicon wafer in a container;
providing a volume of oxidant-etchant solution in the container, wherein the oxidant-etchant solution comprises an etching agent and an oxidizing agent;
agitating the oxidant-etchant solution in the container to etch a surface of the silicon wafer, wherein the etched surface has a solar spectrum weighted reflection of less than 5 percent.

18. The method of claim 17, wherein the catalytic metal particles are deposited with a particle size to particle-to-particle spacing ratio on the silicon surface in the range of 3 to 5 or with a particle-to-particle spacing in the range of 3 to 8 nanometers.

19. The method of claim 17, wherein the etching solution comprises HF and H$_2$O$_2$ and wherein the etching solution has a value of rho ($\rho$) of at least about 74 percent, $\rho$ being defined as a molar concentration of HF divided by a sum of the molar concentrations of HF and H$_2$O$_2$.

20. The method of claim 17, further comprising, at least partially concurrently with the agitating, heating the oxidant-etchant solution to at least about 50° C., wherein the agitating is performed for at least about 5 minutes, whereby the solar spectrum weighted reflection is less than about 3 percent.

* * * * *